United States Patent [19]
Horvath

[11] 3,980,053
[45] Sept. 14, 1976

[54] FUEL SUPPLY APPARATUS FOR INTERNAL COMBUSTION ENGINES

[75] Inventor: Stephen Horvath, St. Ives, Australia

[73] Assignee: Beeston Company Limited, Hong Kong, Hong Kong

[22] Filed: Nov. 25, 1974

[21] Appl. No.: 527,085

Related U.S. Application Data

[63] Continuation-in-part of Ser. No. 485,498, July 3, 1974, abandoned.

[52] U.S. Cl. .............................. 123/3; 123/119 E; 123/DIG. 12; 204/129; 204/228
[51] Int. Cl.² ..................... F02B 1/00; F02B 67/00; C25B 1/04; F02M 7/00
[58] Field of Search ..................... 204/129, 228; 123/119 E, DIG. 12, 3

[56] References Cited
UNITED STATES PATENTS

| | | | |
|---|---|---|---|
| 1,262,034 | 4/1918 | Frazer | 123/119 E |
| 1,380,183 | 5/1921 | Boisen | 204/230 |
| 1,905,627 | 4/1933 | Holland | 204/230 |
| 2,365,330 | 12/1944 | Carmichael | 204/275 |
| 2,496,623 | 2/1950 | Fragale | 123/65 |
| 3,330,755 | 7/1967 | Mahany | 204/230 |
| 3,648,668 | 3/1972 | Pacheco | 123/3 |
| 3,755,128 | 8/1973 | Herwig | 204/230 |

FOREIGN PATENTS OR APPLICATIONS

| | | | |
|---|---|---|---|
| 353,570 | 7/1931 | Germany | 123/3 |

OTHER PUBLICATIONS

"Electroplating Engineering Handbook," 2nd Ed., A. K. Graham, 1962, pp. 670–671.

*Primary Examiner*—R. L. Andrews
*Attorney, Agent, or Firm*—Biebel, French & Nauman

[57] ABSTRACT

A fuel supply apparatus generates hydrogen and oxygen by electrolysis of water. There is provided an electrolytic cell which has a circular anode surrounded by a cathode with a porous membrane therebetween. The anode is fluted and the cathode is slotted to provide anode and cathode areas of substantially equal surface area. A pulsed electrical current is provided between the anode and cathode for efficient generation of hydrogen and oxygen. The electrolytic cell is equipped with a float, which detects the level of electrolyte within the cell, and water is added to the cell as needed to replace the water lost through the electrolysis process.

The hydrogen and oxygen are collected in chambers which are an integral part of the electrolytic cell, and these two gases are supplied to a mixing chamber where they are mixed in the ratio of two parts hydrogen to one part oxygen. This mixture of hydrogen and oxygen flows to another mixing chamber wherein it is mixed with air from the atmosphere. The system is disclosed as being installed in an automobile, and a dual control system, which is actuated by the automobile throttle, first meters the hydrogen and oxygen mixture into the chamber wherein it is combined with air and then meters the combined mixture into the automobile engine. The heat of combustion of a pure hydrogen and oxygen mixture is greater than that of a gasoline and air mixture of comparable volume, and air is therefore mixed with the hydrogen and oxygen to produce a composite mixture which has a heat of combustion approximating that of a normal gas-air mixture. This composite mixture of air, hydrogen and oxygen then can be supplied directly to a conventional internal combustion engine without overheating and without creation of a vacuum in the system.

18 Claims, 41 Drawing Figures

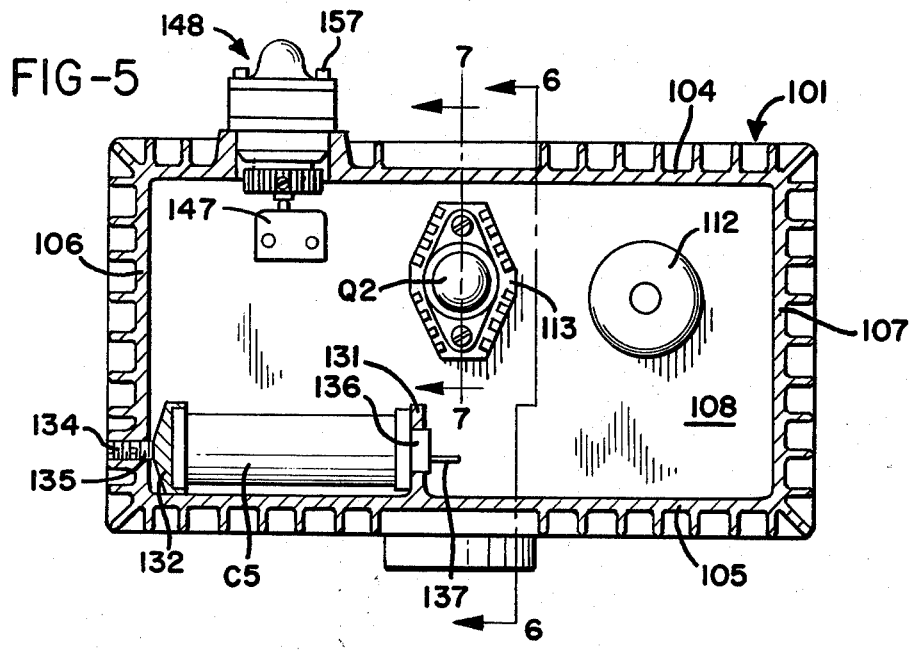
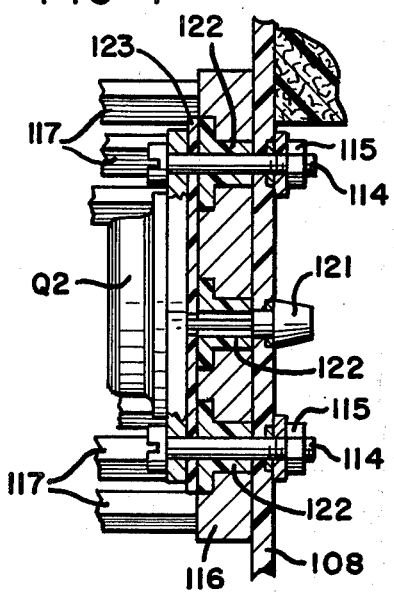
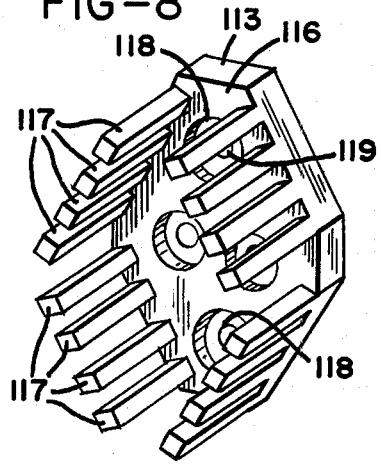
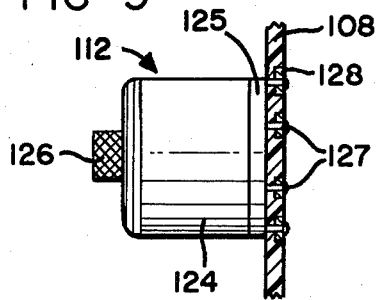

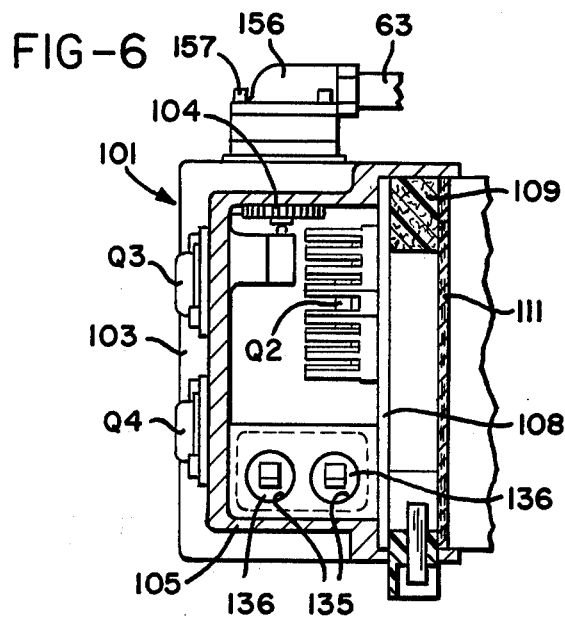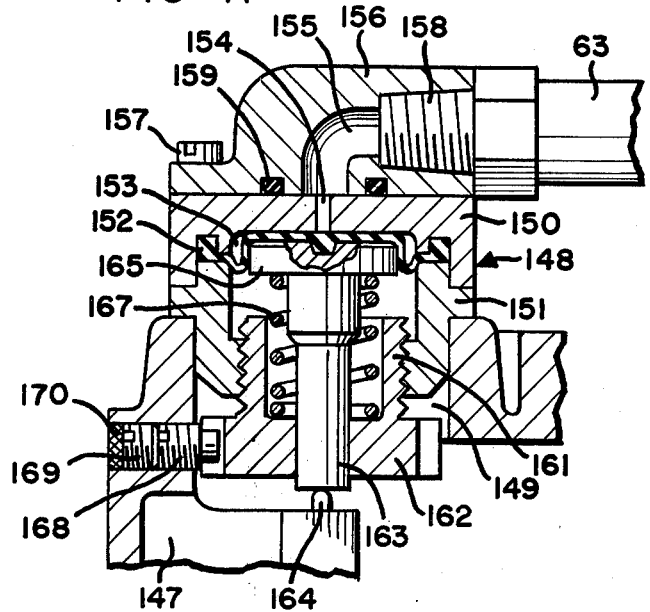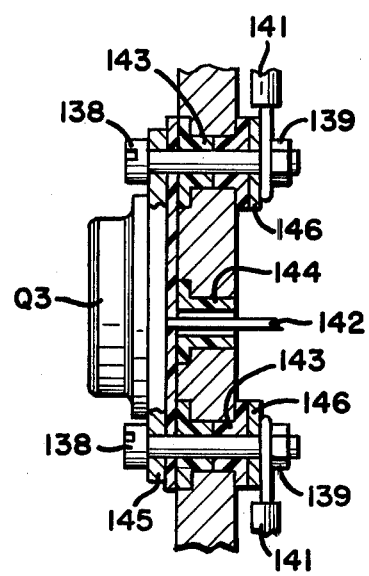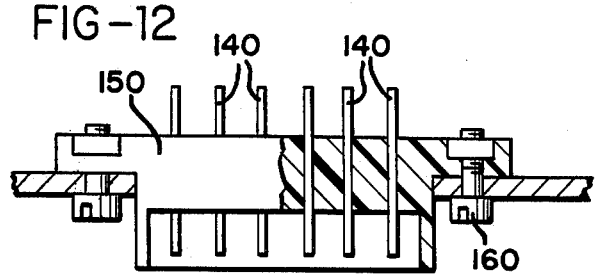

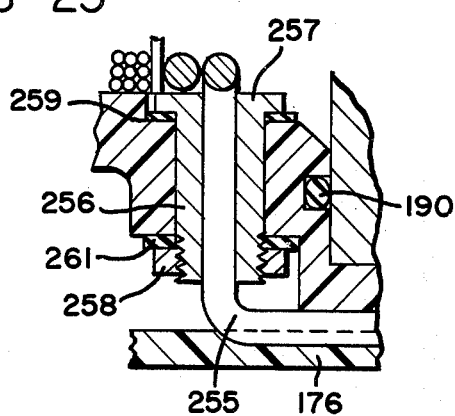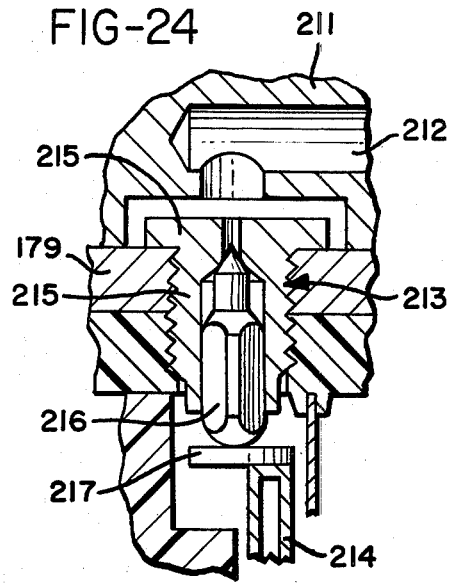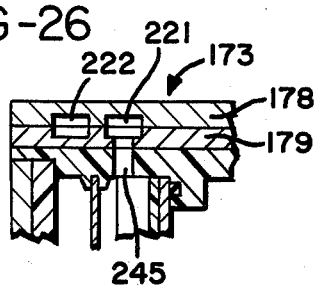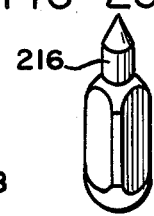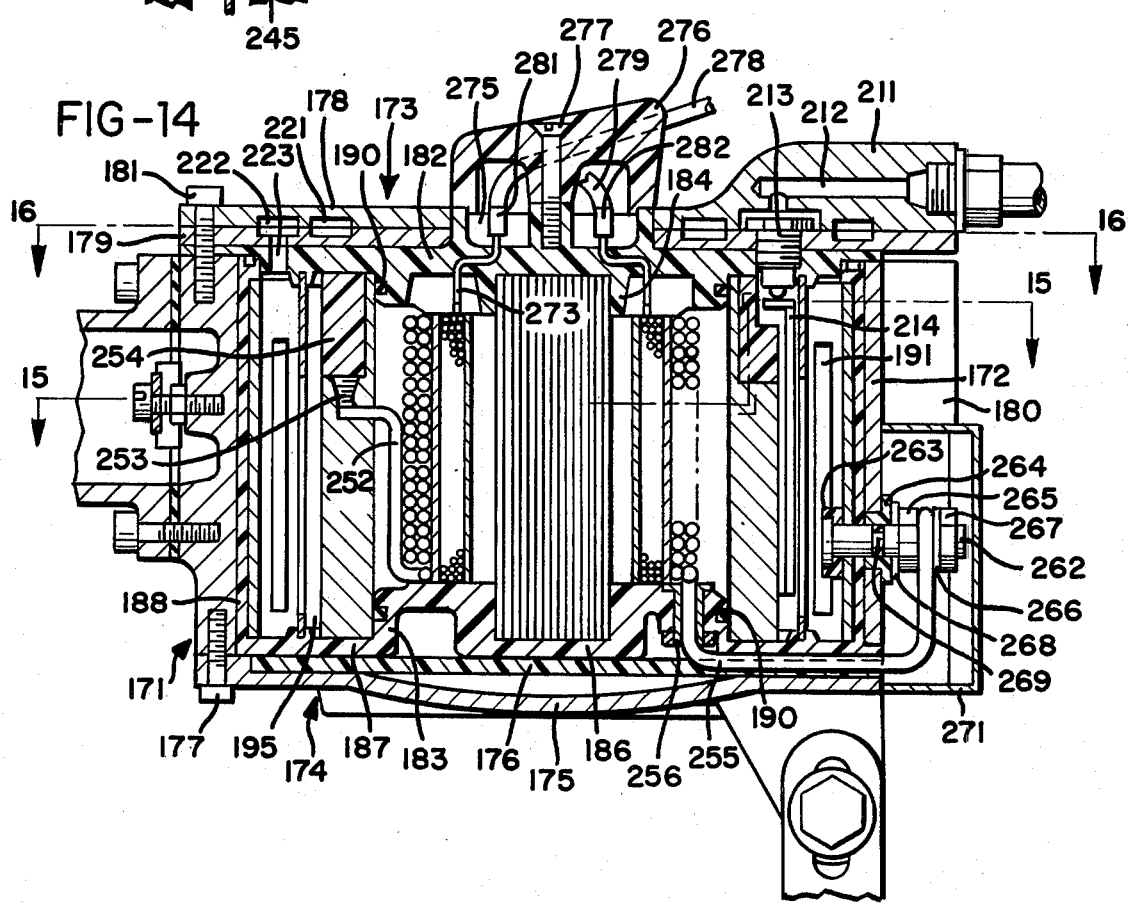

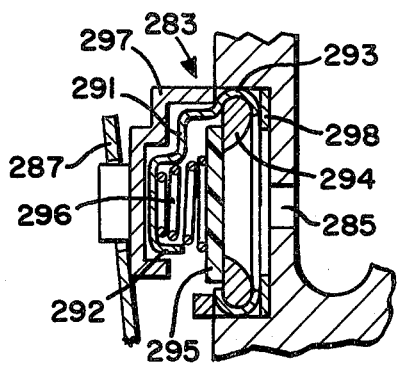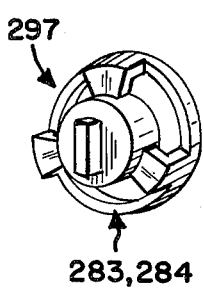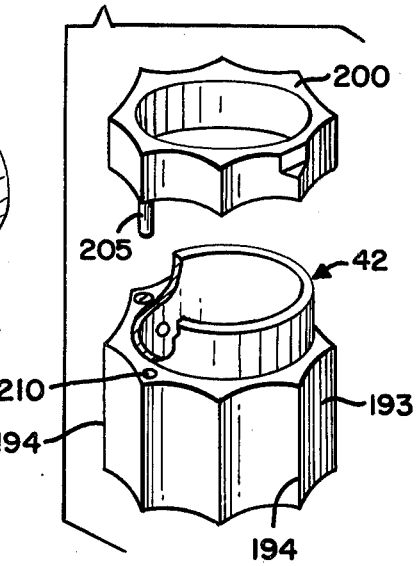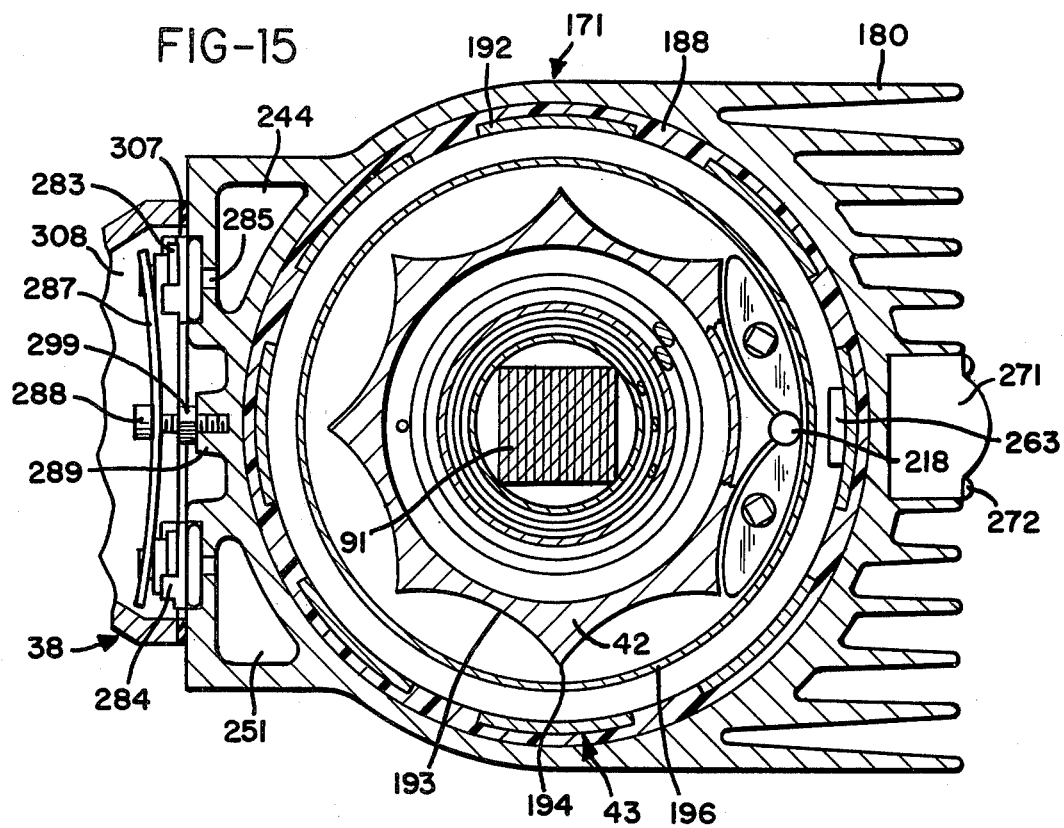

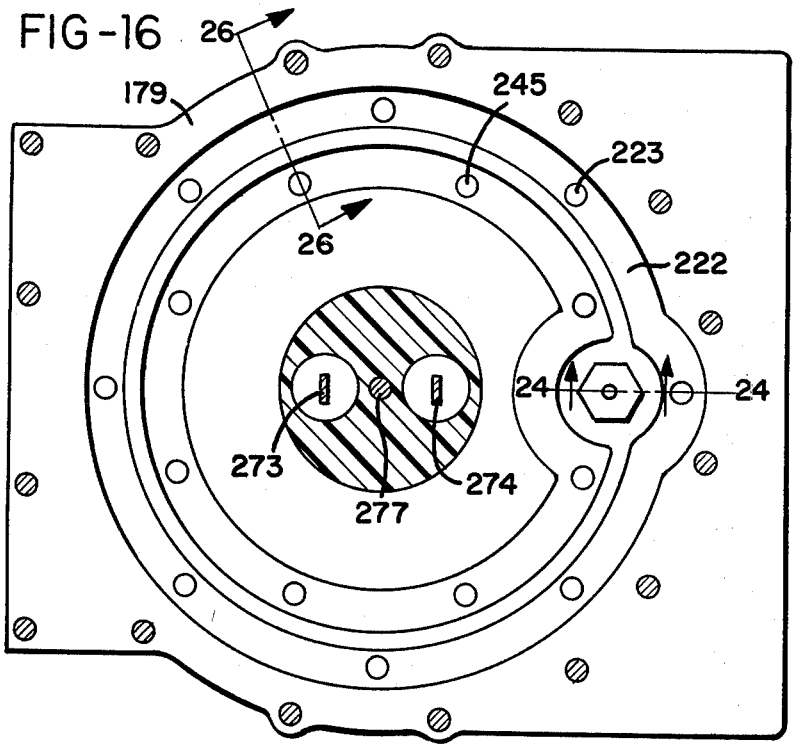
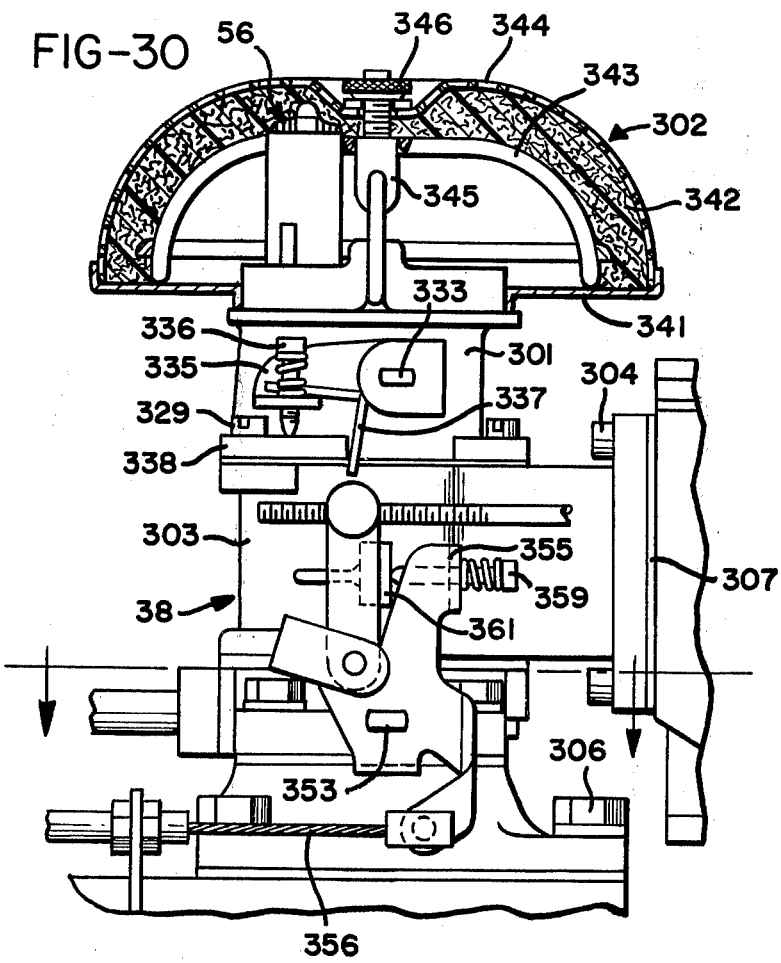

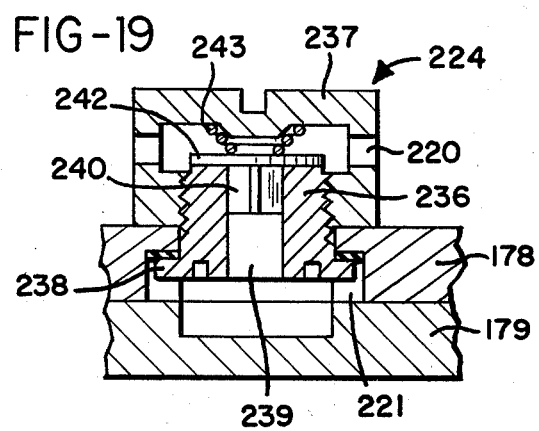
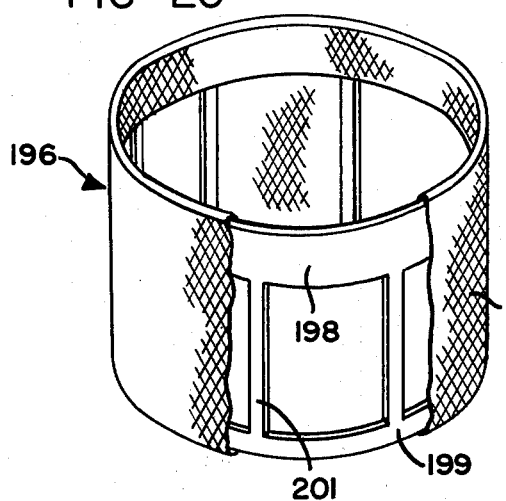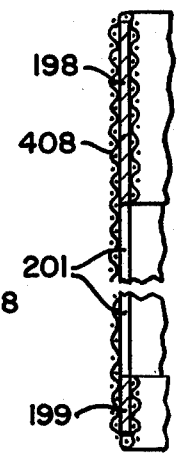
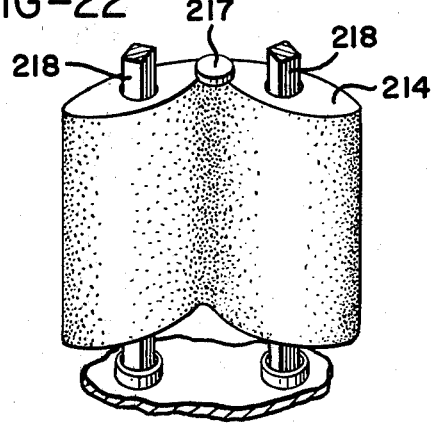

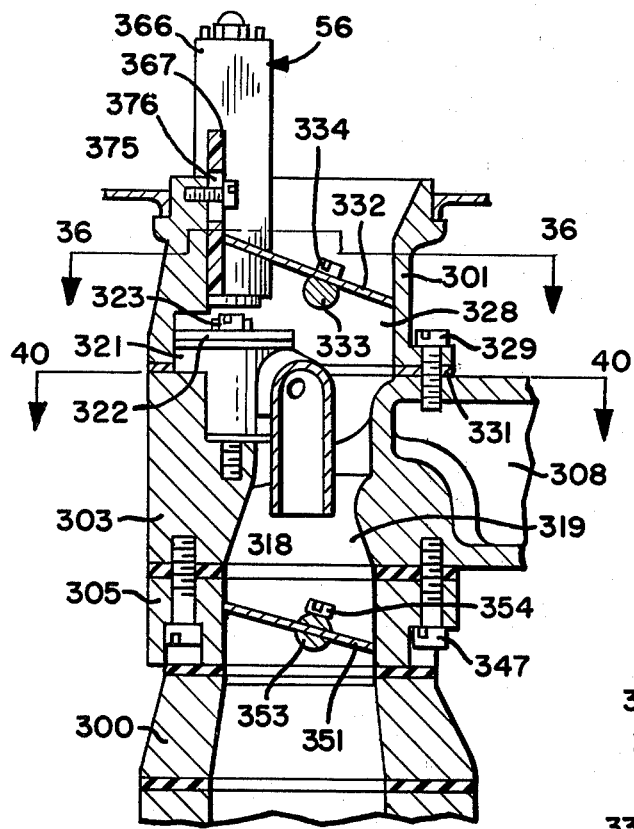
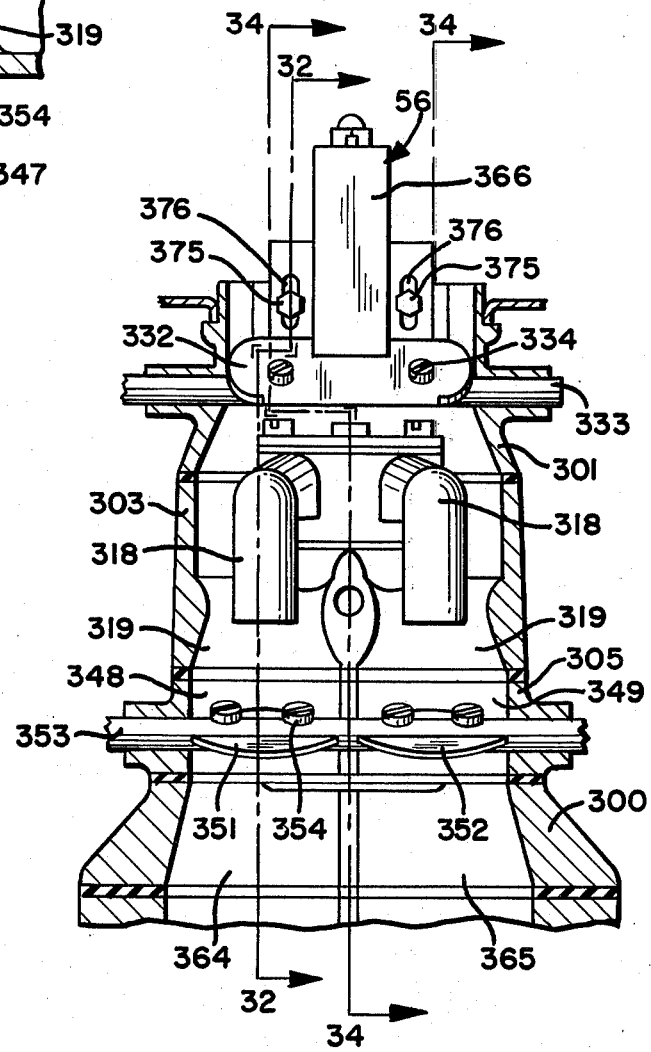
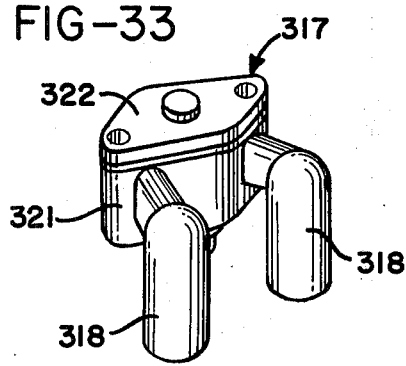

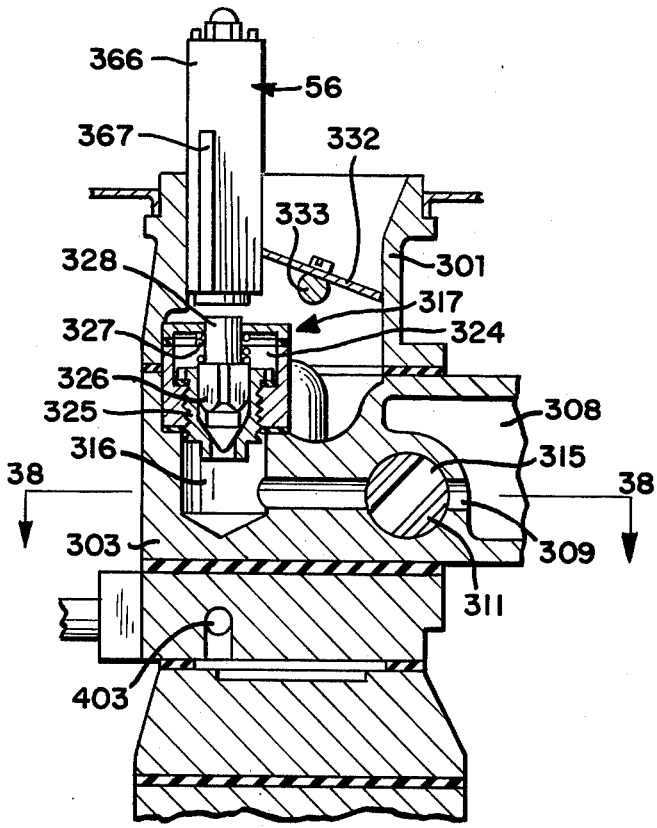
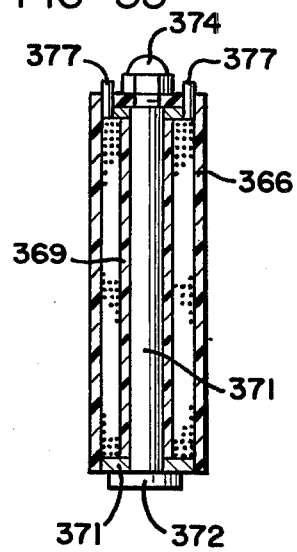
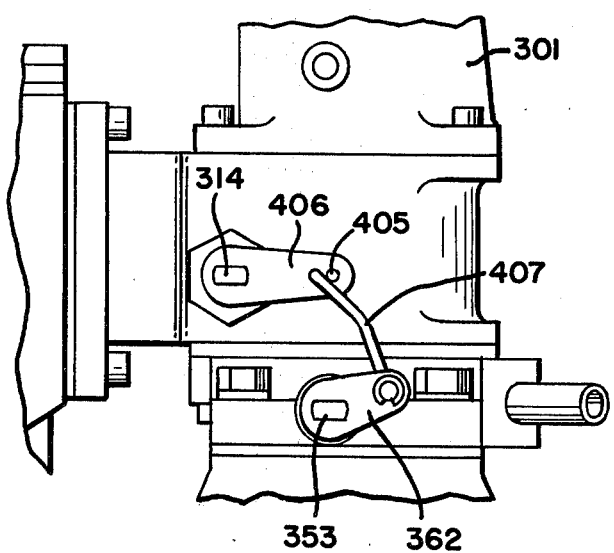
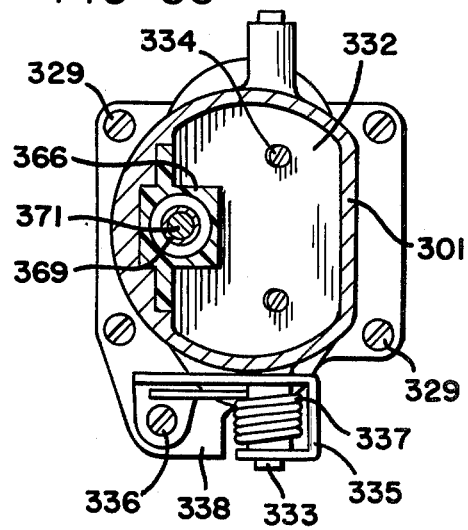

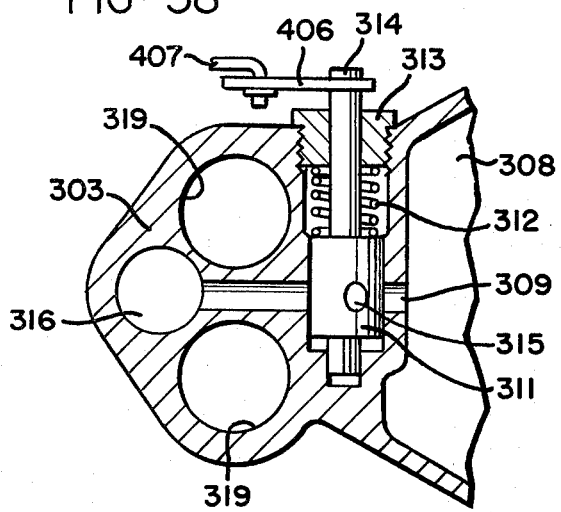
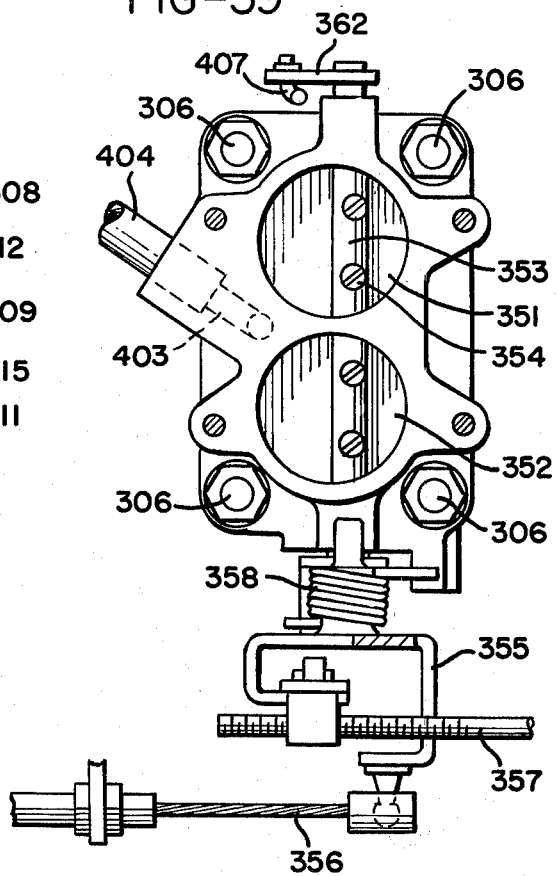
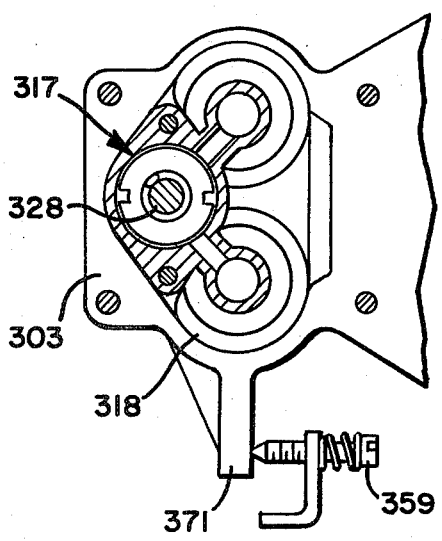
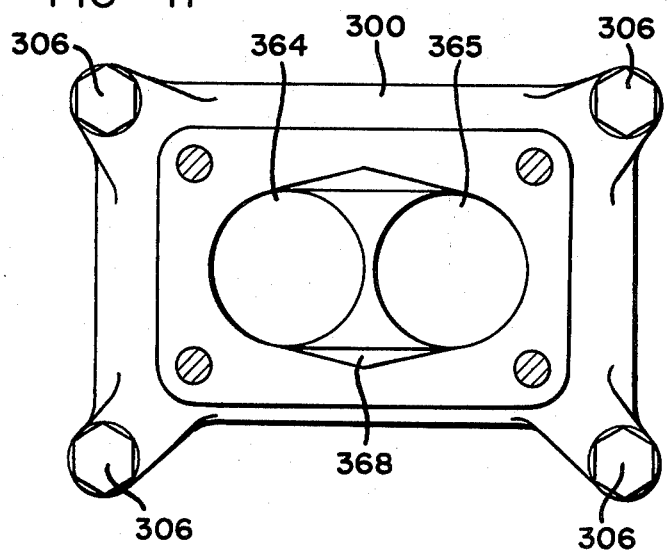

FUEL SUPPLY APPARATUS FOR INTERNAL COMBUSTION ENGINES

CROSS REFERENCE TO RELATED APPLICATION

This application is a continuation-in-part of my earlier application Ser. No. 485,498 filed July 3, 1974 abandoned.

BACKGROUND OF THE INVENTION

This invention relates to internal combustion engines. More particularly it is concerned with a fuel supply apparatus by means of which an internal combustion engine can be run on a fuel comprised of hydrogen and oxygen gases generated on demand by electrolysis of water.

In electrolysis a potential difference is applied between an anode and a cathode in contact with an electrolytic conductor to produce an electric current through the electrolytic conductor. Many molten salts and hydroxides are electrolytic conductors but usually the conductor is a solution of a substance which dissociates in the solution to form ions. The term "electrolyte" will be used herein to refer to a substance which dissociates into ions, at least to some extent, when dissolved in a suitable solvent. The resulting solution will be referred to as an "electrolyte solution".

Faraday's Laws of Electrolysis provide that in any electrolysis process the mass of substance liberated at an anode or cathode is in accordance with the formula $$m = z q$$

where $m$ is the mass of substance liberated in grams, $z$ is the electrochemical equivalent of the substance, and $q$ is the quantity of electricity passed, in coulombs. An important consequence of Faraday's Laws is that the rate of decomposition of an electrolyte is dependent on current and is independent of voltage. For example, in a conventional electrolysis process in which a constant current I amps flows to $t$ seconds, $q = It$ and the mass of material deposited or dissolved will depend on $I$ regardless of voltage, provided that the voltage exceeds the minimum necessary for the electrolysis to proceed. For most electrolytes, the minimum voltage is very low.

There have been previous proposals to run internal combustion engines on a fuel comprised of hydrogen gas. Examples of such proposals are disclosed in U.S. Pat. Nos. 1,275,481, 2,183,674 and 3,471,274 and British specifications Nos., 353,570 and 364,179. It has further been proposed to derive the hydrogen from electrolysis of water, as exemplified by U.S. Pat. No. 1,380,183. However, none of the prior art constructions is capable of producing hydrogen at a rate such that it can be fed directly to internal combustion engines without intermediate storage. The present invention enables a fuel comprised of hydrogen and oxygen gases to be generated by electrolysis of water at such a rate that it can sustain operation of an internal combustion engine. It achieves this result by use of an improved electrolysis process of the type generally proposed in the parent application hereof.

As disclosed in my aforesaid parent application the prior art also shows electrolytic reactions employing DC or rectified AC which necessarily will have a ripple component; an example of the former being shown for instance in Kilgus U.S. Pat. No. 2,016,442 and an example of the latter being shown in Emich al. U.S. Pat. No. 3,485,742. It will be noted that the Kilgus Patent also discloses the application of a magnetic field to his electrolyte, which field is said to increase the production of gas at the two electrodes.

SUMMARY OF THE INVENTION

The apparatus of the invention applies a pulsating current to an electrolytic solution of an electrolyte in water. Specifically, it enables high pulses of quite high current value and appropriately low voltage to be generated in the electrolyte solution by a direct input supply to produce a yield of electrolysis products such that these products may be fed directly to the internal combustion engine. The pulsating current generated by the apparatus of the present invention is to be distinguished from normal variations which occur in rectification of AC current and as hereinafter employed the term pulsed current will be taken to mean current having a duty cycle of less than 0.5.

It is a specific object of this invention to provide a fuel supply apparatus for an internal combustion engine by which hydrogen and oxygen gases generated by electrolysis of water are mixed together and fed directly to the internal combusion engine.

A still further object of the invention is to provide, for use with an internal combustion engine having inlet means to receive a combustible fuel, fuel supply apparatus comprising:

a vessel to hold an electrolyte solution of electrolyte dissolved in water;

an anode and a cathode to contact the electrolyte solution within the vessel;

electrical supply means to apply between said diode and said cathode pulses of electrical energy to induce a pulsating current in the electrolyte solution thereby to generate by electrolysis hydrogen gas at the cathode and oxygen gas at the anode;

gas collection and delivery means to collect the hydrogen and oxygen gases and to direct them to the engine inlet means; and water admission means for admission of water to said vessel to make up loss due to electrolysis.

In order that the invention may be more fully explained one particular example of an automobile internal combustion engine fitted with fuel supply apparatus in accordance with the invention will now be described in detail with reference to the accompanying drawings.

BRIEF DESCRIPTION OF THE DRAWINGS

FIG. 5 is a cross-section on the line 5—5 in FIG. 3;

FIG. 6 is a cross-section on the line 6—6 in FIG. 5;

FIG. 7 is a cross-section on the line 7—7 in FIG. 5;

FIG. 8 is a perspective view of a diode heat sink included in the components illustrated in FIGS. 5 and 7;

FIG. 9 illustrates a transformer coil assembly included in the electrical components mounted within the housing;

FIG. 10 is a cross-section on the line 10—10 in FIG. 4;

FIG. 11 is a cross-section on the line 11—11 in FIG. 5;

FIG. 12 is a cross-section through a terminal block mounted in the floor of the housing;

FIG. 14 is a cross-section on the line 14—14 in FIG. 13;

FIG. 15 is a cross-section generally on the line 15—15 in FIG. 14;

FIG. 16 is a cross-section on the line 16—16 in FIG. 14;

FIG. 19 is a vertical cross-section through a gas valve taken generally on line 19—19 in FIG. 13;

FIG. 20 is a perspective view of a membrane assembly disposed in the electrolytic cell;

FIG. 21 is a cross-section through part of the membrane assembly;

FIG. 22 is a perspective view of a float disposed in the electrolytic cell;

FIG. 23 is an enlargement of part of FIG. 14;

FIG. 24 is an enlarged cross-section on the line 24—24 in FIG. 16;

FIG. 25 is a perspective view of a water inlet valve member included in the components shown in FIG. 24;

FIG. 26 is a cross-section on line 26—26 in FIG. 16;

FIG. 27 is an exploded and partly broken view of a cathode and cathode collar fitted to the upper end of the cathode;

FIG. 28 is an enlarged cross-section showing some of the components of FIG. 15;

FIG. 29 is a perspective view of a valve cover member;

FIG. 30 shows a gas mixing and delivery unit of the apparatus generally in side elevation but with an air filter assembly included in the unit shown in section;

FIG. 31 is a vertical cross-section through the gas mixing and delivery unit with the air filter assembly removed;

FIG. 32 is a cross-section on the line 32—32 in FIG. 31;

FIG. 33 is a perspective view of a valve and jet nozzle assembly incorporated in the gas mixing and delivery unit;

FIG. 34 is a cross-section generally on the line 34—34 in FIG. 31;

FIG. 35 is a cross-section through a solenoid assembly;

FIG. 36 is a cross-section on the line 36—36 in FIG. 32; FIG. 32;

FIG. 37 is a rear elevation of part of the gas mixing and delivery unit;

FIG. 38 is a cross-section on the line 38—38 in FIG. 34;

FIG. 39 is a plan view of the lower section of the gas mixing and delivery unit, which is broken away from the upper section along the interface 39—39 of FIG. 30;

FIG. 40 is a cross-section on the line 40—40 in FIG. 32; and

FIG. 41 is a plan of a lower body part of the gas mixing and delivery unit.

DESCRIPTION OF THE PREFERRED EMBODIMENT

Figure 1:
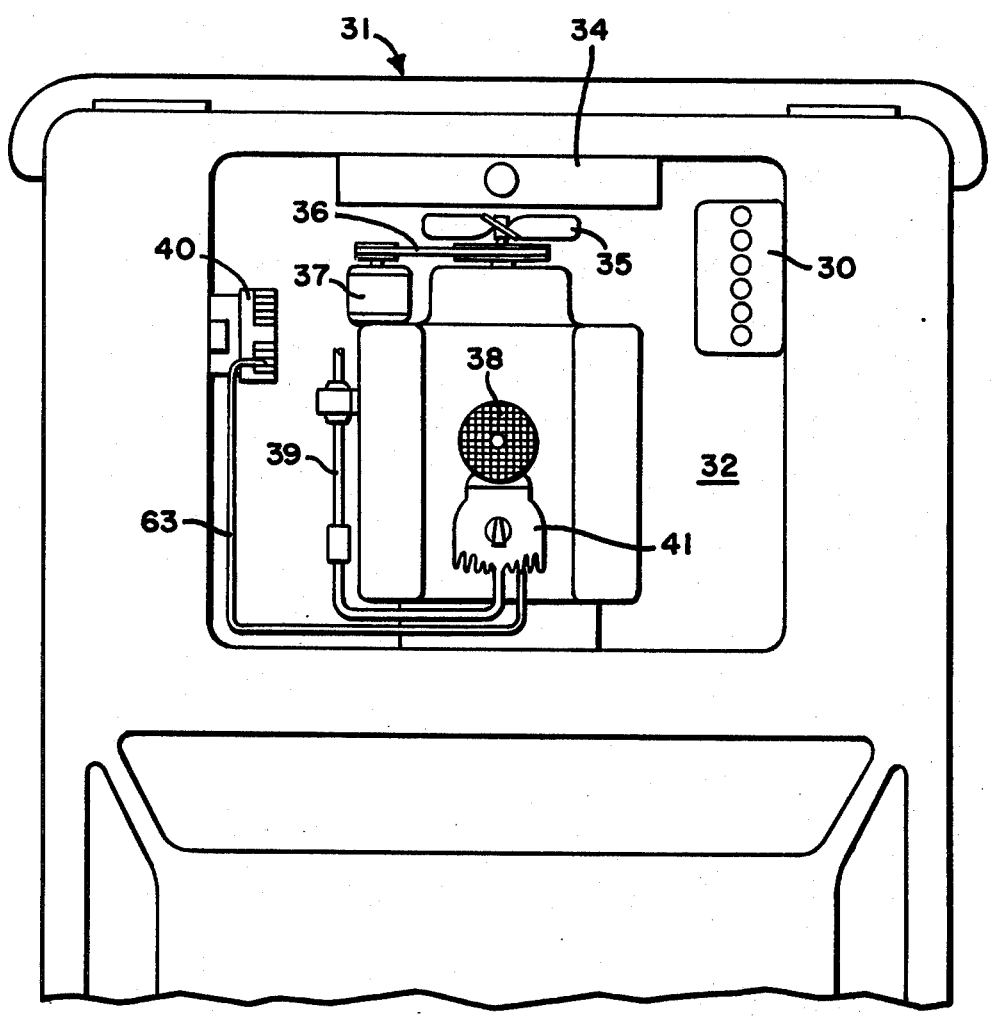
FIG. 1 is a plan view of part of the automobile with its engine bay exposed to show the layout of the fuel supply apparatus and the manner in which it is connected to the automobile engine.

FIG. 1 shows an assembly denoted generally as 31 having an engine bay 32 in which an internal combustion engine 33 is mounted behind a radiator 34. Engine 33 is a conventional engine and, as illustrated, it may have two banks of cylinders in "V" formation. Specifically, it may be a V8 engine. It is generally of conventional construction and FIG. 1 shows the usual cooling fan 34, fan belt 36 and generator or alternator 37.

In accordance with the invention the engine does not run on the usual petroleum fuel but is equipped with fuel supply apparatus which supplies it with a mixture of hydrogen and oxygen gases generated as products of a water electrolysis process carried out in the fuel supply apparatus. The major components of the fuel supply apparatus are an electrolytic cell denoted generally as 41 and a gas mixing and delivery unit 38 to mix the hydrogen and oxygen gases generated within the cell 41 and to deliver them to engine 33. The electrolytic cell 41 receives water through a water delivery line 39 to make up the electrolyte solution within it. It has an anode and a cathode which contact the electrolyte solution, and in operation of the apparatus pulses of electrical energy are applied between the anode and cathode to produce pulses of high current flow through the electrolyte solution. Some of the electrical components necessary to produce the pulses of electrical energy applied between the anode and cathode are carried in a housing 40 mounted on one side of engine bay 32. The automobile battery 30 is mounted at the other side of the engine bay.

Before the physical construction of the fuel delivery apparatus is described in detail the general principles of its operation will firstly be described with reference to the electrical circuit diagram of FIG. 2.

In the illustrated circuit terminals 44, 45, 46 are all connected to the positive terminal of the automobile battery 30 and terminal 47 is connected to the negative terminal of that battery. Switch 48 is the usual ignition switch of the automobile and closure of this switch provides current to the coil 49 of a relay 51. The moving contact 52 of relay 51 receives current at 12 volts from terminal 45, and when the relay is operated by closure of ignition switch 48 current is supplied through this contact to line 53 so that line 53 may be considered as receiving a positive input and line 54 from terminal 47 may be considered as a common negative for the circuit. Closure of ignition switch 48 also supplies current to one side of the coil 55 of a solenoid 56. The other side of solenoid coil 55 is earthed by a connection to the automobile body within the engine bay. As will be explained below solenoid 56 must be energized to open a valve which controls supply of hydrogen and oxygen gases to the engine and the valve closes to cut off that supply as soon as ignition switch 48 is opened.

The function of relay 51 is to connect circuit line 53 directly to the positive terminal of the automobile battery so that it receives a positive signal directly rather than through the ignition switch and wiring.

The circuit comprises pulse generator circuitry which includes unijunction transistor Q1 with associated resistors R1, R2 and R3 and capacitors C2 and C3. This circuitry produces pulses which are used to trigger an NPN silicon power transistor Q2 which in turn provides via a capacitor C4 triggering pulses for a thyristor T1.

Resistor R1 and capacitor C2 are connected in series in a line 57 extending to one of the fixed contacts of a relay 58. The coil 59 of relay 58 is connected between line 53 and a line 61 which extends from the moving contact of the relay to the common negative line 54 via a normally closed pressure operated switch 62. The pressure control line 63 of switch 62 is connected in a manner to be described below to a gas collection chamber of electrolytic cell 41 in order to provide a control connection whereby switch 62 is opened when the gas in the collection chamber reaches a certain pressure. However, provided that switch 62 remains closed, relay 58 will operate when ignition switch 48 is closed to provide a connection between lines 57 and 61 thereby to connect capacitor C2 to the common negative line 54. The main purpose of relay 58 is to provide a slight delay in this connection between the capacitor C2 and the common negative line 54 when the circuit is first energized. This will delay the generation of triggering pulses to thyristor T1 until a required electrical condition has been achieved in the transformer circuitry to be described below. Relay 58 is hermetically sealed and has a balanced armature so that it can operate in any position and can withstand substantial shock or vibration when the automobile is in use.

When the connection between capacitor C2 and line 54 is made via relay 58, unijunction transistor Q1 will act as an oscillator to provide positive output pulses in line 64 at a pulse rate which is controlled by the ratio of R1:C1 and at a pulse strength determined by the ratio of R2:R3. These pulses will charge the capacitor C3. Electrolytic capacitor C1 is connected directly between the common positive line 53 and the common negative line 54 to filter the circuitry from all static noise.

Resistor R1 and capacitor C2 are chosen such that at the input to transistor Q1 the pulses will be of saw tooth form. This will control the form of the pulses generated in the subsequent circuitry and the saw tooth pulse form is chosen since it is believed that it produces the most satisfactory operation of the pulsing circuitry. It should be stressed, however, that other pulse forms, such as square wave pulses, could be used. Capacitor C3 discharges through a resistor R4 to provide triggering signals for transistor Q2. Resistor R4 is connected to the common negative line 54 to serve as a gate current limiting device for transistor Q2.

The triggering signals produced by transistor Q2 via the network of capacitor C3 and a resistor R4 will be in the form of positive pulses of sharply spiked form. The collector of transistor Q2 is connected to the positive supply line 53 through resistor R6 while the emitter of that transistor is connected to the common negative line 54 through resistor R5. These resistors R5 and R6 control the strength of current pulses applied to a capacitor C4, which discharges through a resistor R7 to the common negative line 54, thereby to apply triggering signals to the gate of thyristor T1. The gate of thyristor T1 receives a negative bias from the common negative line via resistor R7 which thus serves to prevent triggering of the thyristor by inrush currents.

The triggering pulses applied to the gate of thyristor T1 will be very sharp spikes occurring at the same frequency as the saw tooth wave form pulses established by unijunction transistor Q1. It is preferred that this frequency be of the order of 10,000 pulses per minute and details of specific circuit components which will achieve this result are listed below. Transistor Q2 serves as an interface between unijunction transistor Q1 and thyristor T1, preventing back flow of emf from the gate of the thyristor which might otherwise interfere with the operation of transistor Q1. Because of the high voltages being handled by the thyristor and the high back emf applied to transistor Q2, the latter transistor must be mounted on a heat sink.

The cathode of thyristor T1 is connected via a line 65 to the common negative line 54 and the anode is connected via a line 66 to the centre of the secondary coil 67 of a first stage transformer TR1. The two ends of transformer coil 67 are connected via diodes D1 and D2 and a line 68 to the common negative line 54 to provide full wave rectification of the transformer output.

First stage transformer T1 has three primary coils 71, 72, 73 wound together with secondary coil 67 about a core 74. This transformer may be of conventional half cup construction with a ferrite core. The secondary coil may be wound on to a coil former disposed about the core and primary coils 71 and 73 may be wound in bifilar fashion over the secondary coil. The other primary coil 72 may then be wound over the coils 71, 73. Primary coils 71 and 73 are connected at one side by a line 75 to the uniform positive potential of circuit line 53 and at their other sides by lines 79, 81 to the collectors of transistors Q3, Q4. The emitters of transistors Q3, Q4 are connected permanently via a line 82 to the common negative line 54. A capacitor C6 is connected between lines 79, 81 to act as a filter preventing any potential difference between the collectors of transistors Q3, Q4.

The two ends of primary coil 72 are connected by lines 83, 84 to the bases of transistors Q3, Q4. This coil is centre tapped by a line 85 connected via resistor R9 to the positive line 53 and via resistor R10 to the common negative line 54.

When power is first applied to the circuit transistors Q3 and Q4 will be in their non-conducting states and there will be no current in primary coils 71, 73. However, the positive current in line 53 will provide via resistor R9 a triggering signal applied to the centre tap of coil 72 and this signal operates to trigger alternate high frequency oscillation of transistors Q3, Q4 which will result in rapid alternating pulses in primary coils 71, 73. The triggering signal applied to the centre tap of coil 72 is controlled by the resistor network provided by resistors R9 and R10 such that its magnitude is not sufficient to enable it to trigger Q3 and Q4 simultaneously but is sufficient to trigger one of those transistors. Therefore only one of the transistors is fired by the initial triggering signal to cause a current to flow through the respective primary coil 71 or 73. The signal required to hold the transistor in the conducting state is much less than that required to trigger it initially, so that when the transistor becomes conductive some of the signal applied to the centre tap of coil 72 will be diverted to the non-conducting transistor to trigger it. Wnen the second transistor is thus fired to become conductive, current will flow through the other of the primary coils 71, 73, and since the emitters of the two transistors are directly connected together, the positive output of the second transistor will cause the first-fired transistor to be shut off. When the current drawn by the collector of the second-fired resistor drops, part of the signal on the centre tap of coil 72 is diverted back to the collector of the first transistor which is re-fired. It will be seen that the cycle will then repeat indefinitely so that transistors Q3, Q4 are alternately fired and shut off in very rapid sequence. Thus current pulses flow in alternate sequence through primary coils 71, 73 at a very high frequency, this frequency being constant and independent of changes in input voltage to the circuit. The rapidly alternating pulses in primary coils 71 and 73, which will continue for so long as ignition switch 48 remains closed, will generate higher voltage signals at the same frequency in the transformer secondary coil 67.

A dump capacitor C5 bridged by a resistor R8 is connected by a line 86 to the line 66 from the secondary coil of transformer TR1 and provides the output from that transformer which is fed via line 87 to a second stage transformer TR2.

When thyristor T1 is triggered to become conductive the full charge of dump capacitor C5 is released to second stage transformer TR2. At the same time the first stage of transformer TR1 ceases to function because of this momentary short circuit placed across it and consequently thyristor T1 releases, i.e. becomes non-conductive. This permits charge to be built up again in dump capacitor C5 for release when the thyristor is next triggered by a signal from transistor Q2. Thus during each of the intervals when the thyristor is in its non-conducting state the rapidly alternating pulses in primary coils 71, 73 of transformer TR1 produced by the continuously oscillating transistors Q3, Q4 produce, via the transformer coupling, relatively high voltage output pulses which build up a high charge in capacitor C5, and this charge is released suddenly when the thyristor is triggered. In a typical apparatus using a 12 volt DC supply battery pulses of the order of 22 amps at 300 volts may be produced in line 87.

As previously mentioned relay 58 is provided in the circuit to provide a delay in the connection of capacitor C2 to the common negative line 54. This delay, although very short, is sufficient to enable transistors Q3, Q4 to start oscillating to cause transformer TR1 to build up a charge in dumping capacitor C5 before the first triggering signal is applied to thyristor T1 to cause discharge of the capacitor.

Transformer TR2 is a step-down transformer which produces pulses of very high current flow at low voltage. It is built into the anode of electrolytic cell 41 and comprises a primary coil 88 and a secondary coil 89 wound about a core 91. Secondary coil 89 is formed of heavy wire in order to handle the large current induced in it and its ends are connected directly to the anode 42 and cathode 43 of the electrolytic cell 41 in a manner to be described below.

In a typical apparatus, the output from the first stage transformer TR1 would be 300 volt pulses of the order of 22 amps at 10,000 pulses per minute and a duty cycle of slightly less than 0.006. This can be achieved from a uniform 12 volt and 40 amps DC supply using the following circuit components:

R1 2.7 K ohms ½ watt 2% resistor
R2 220 ohms ½ watt 2% resistor
R3 100 ohms ½ watt 2% resistor
R4 22 K ohms ½ watt 2% resistor
R5 100 ohms ½ watt 2% resistor
R6 220 ohms ½ watt 2% resistor
R7 1 K ohms ½ watt 2% resistor
R8 10 M ohms 1 watt 5% resistor
R9 100 ohms 5 watt 10% resistor
R10 5.6 ohms 1 watt 5% resistor
C1 2200 MF 16V electrolytic capacitor
C2 2.2 MF 100V 10% capacitor
C3 2.2 MF 100V 10% capacitor
C4 1 MF 100V 10% capacitor
C5 1 MF 1000V Ducon paper capacitor 5S10A
C6 0.002 MF 160V capacitor
Q1 2N 2647 PN unijunction transistor
Q2 2N 3055 NPN silicon power transistor
Q3 2N 3055 NPN silicon power transistor
Q4 2N 3055 NPN silicon power transistor
T1 BTW 30–800 RM fast turn-off thyristor
D1 A 14 P diode
D2 A 14 P diode
L1 Indicator lamp
SV1 continuously rated solenoid
RL1 PW5LS hermetically sealed relay
PS1 P658A-10051 pressure operated micro switch
TR1 Half cup transformer cores 36/22-341

Coil former 4322-021-30390 wound to provide a turns ratio between secondary and primary of 18:1
  Secondary coil 67 = 380 turns
  Primary coil 71 = 9 turns
  Primary coil 73 = 9 turns
  Primary coil 72 = 4 turns The installation of the above circuit components is illustrated in FIGS. 3 to 13. They are mounted within and on a housing which is denoted generally as 101 and which is fastened to a side wall of the automobile engine bay 32 via a mounting bracket 102. Housing 101, which may be formed as an aluminium casting, has a front wall 103, top and bottom walls 104, 105 and side walls 106, 107. All of these walls have external cooling fins. The back of housing 101 is closed by a printed circuit board 108 which is held clamped in position by a peripheral frame 109 formed of an insulated plastics material clamped between the circuit board and mounting bracket 102. An insulating sheet 111 of cork is held between the frame 109 and mounting bracket 102.

Printed circuit board 108 carries all of the above-listed circuit components except for capacitor C5 and transistors Q3 and Q4. FIG. 5 illustrates the position in which transistor Q2 and the coil assembly 112 of transformer TR1 are mounted on the printed circuit board. Transistor Q2 must withstand considerable heat generation and it is therefore mounted on a specially designed heat sink 113 clamped to circuit board 108 by clamping screws 114 and nuts 115. As most clearly illustrated in FIGS. 7 and 8, heat sink 113 has a flat base plate portion 116 which is generally diamond shaped and a series of rod like cooling fins 117 project to one side of the base plate around its periphery. It has a pair of countersunk holes 118 of the clamping screws and a similar pair of holes 119 to receive the connector pins 121 which connect transistor Q2 to the printed circuit board. Holes 118, 119 are lined with nylon bushes 122 and a formica sheet 123 is fitted between the transistor and the heat sink so that the sink is electrically insulated from the transistor.

The coil assembly 112 of transformer TR1 (See FIG. 9) is comprised of a casing 124 which contains transformer coils and the associated core and former and is closed by a plastic closing plate 125. Plate 125 is held in position by a clamping stud 126 and is fitted with electrical connector pins 127 which are simply pushed through holes in circuit board 108 and are soldered to appropriate copper conductor strips 128 on the outer face of the board.

For clarity the other circuit components mounted on printed circuit board 108 are not illustrated in the drawings. These are standard small size components and the manner in which they may be fitted to the circuit board is entirely conventional.

Capacitor C5 is mounted within casing 101. More specifically it is clamped in position between a flange 131 which stands up from the floor 105 of the casing and a clamping pad 132 engaged by a clamping screw 133, which is mounted in a threaded hole in casing side wall 106 and is set in position by a lock screw 134. Flange 131 has two holes 135 (See FIG. 6) in which the terminal bosses 136 of capacitor C5 are located. The terminal pins 137 projecting from bosses 136 are connected to the terminal board 108 by wires (not shown) and appropriate connector pins which are extended through holes in the circuit board and soldered to the appropriate conductor strips on the other face of that board.

Transistors Q3 and Q4 are mounted on the front wall 103 of casing 101 so that the finned casing serves as an extended heat sink for these two transistors. ransistors. They are mounted on the casing wall and electrically connected to the printed circuit board in identical fashion and this is illustrated by FIG. 10 which shows the mounting of transistor Q3. As shown in that figure the transistor is clamped in position by clamping screws 138 and nuts 139 which also serve to provide electrical connections to the appropriate conductors of the printed circuit board via conductor wires 141. The third connection from the emitter of the transistor to the common negative conductor of the printed circuit is made by conductor 142. Screws 130 and conductor 142 extend through three holes in the casing front wall 103 and these holes are lined with electrically insulating nylon bushes 143, 144. A formica sheet 145 is sandwiched between casing plate 103 and the transistor which is therefore electrically insulated from the casing. Two washers 146 are placed beneath the ends of conductor wires 141.

Pressure operated microswitch 52 is mounted on a bracket 147 projecting inwardly from front wall 103 of casing 101 adjacent the top wall 104 of the casing and the pressure sensing unit 148 for this switch is installed in an opening 149 through top wall 104. As most clearly seen in FIG. 11, pressure sensing unit 148 is comprised of two generally cylindrical body members 150, 151 between which a flexible diaphragm 152 is clamped to provide a diaphragm chamber 153. The gas pressure of sensing tube 63 is applied to chamber 153 via a small diameter passage 154 in body member 150 and a larger passage 155 in a cap member 156. The cap member and body members are fastened together and clamped to the casing top plate 104 by means of clamping screws 157. Sensing tube 63 is connected to the passage 155 in cap member 156 by a tapered thread connector 158 and the interface between cap member 156 and body member 150 is sealed by an O-ring 159.

The lower end of body member 151 of pressure sensing unit 148 has an internally screw threaded opening which receives a screw 161 which at its lower end is formed as an externally toothed adjusting wheel 162. A switch actuating plunger 163 extends through a central bore in adjusting wheel 162 so that it engages at one end flexible diaphragm 152 and at the other end the actuator member 164 of microswitch 62. The end of plunger 163 which engages the diaphragm has a flange 165 to serve as a pressure pad and a helical compression spring 167 encircles plunger 163 to act between flange 165 and the adjusting wheel 162 to bias the plunger upwardly against the action of the gas pressure acting on diaphragm 152 in chamber 153. The pressure at which diaphragm 152 will force plunger 163 downwardly against the action of spring 167 to cause actuation of switch 62 may be varied by rotating screw 161 and the setting of this screw may be held by a setting screw 168 mounted in a threaded hole in the upper part of casing front wall 103 and projecting inwardly to fit between successive teeth of adjusting wheel 162. After correct setting of screw 161 is achieved set screw 168 will be locked in position by locking screw 169 which is then sealed by a permanent seal 170 to prevent tampering. Microswitch 62 is also electrically connected to the appropriate conductors of the printed circuit board via wires within the housing and connector pins.

Electrical connections are made between the conductors of printed circuit board 108 and the internal wiring of the circuit via a terminal block 150 (FIG. 12) set in an opening of housing floor 105 by screws 160 and fitted with terminal plates 140.

The physical construction of electrolytic cell 41 and the second stage transformer TR2 is illustrated in FIGS. 13 to 29. The cell comprises an outer casing 171 having a tubular peripheral wall 172 and top and bottom closures 173, 174. Bottom closure 174 is comprised of a domed cover 175 and an electrically insulated disc 176 which are held to the bottom of peripheral wall 172 by circumferentially spaced clamping studs 177. Top closure 173 is comprised of a pair of top plates 178, 179 disposed face to face and held by circumferentially spaced clamping studs 181 screwed into tapped holes in the upper end of peripheral wall 172. The peripheral wall of the casing is provided with cooling fins 180.

The anode 42 of the cell is of generally tubular formation. It is disposed vertically within the outer casing and is clamped between upper and lower insulators 182, 183. Upper insulator 182 has a central boss portion 184 and an annular peripheral flange 185 portion the outer rim of which is clamped between upper closure plate 179 and the upper end of peripheral wall 172. Lower insulator 183 has a central boss portion 186, an annular flange portion 187 surrounding the boss portion and an outer tubular portion 188 standing up from the outer margin of flange portion 187. Insulators 182, 183 are moulded from an electrically insulating material which is also alkali resistant. Polytetrafluoroethylene is one suitable material.

When held together by the upper and lower closures, insulators 182, 183 form an enclosure within which anode 42 and the second stage transformer TR2 are disposed. Anode 42 is of generally tubular formation and it is simply clamped between insulators 182, 183 with its cylindrical inner periphery located on the boss portions 184, 186 of those insulators. It forms a transformer chamber which is closed by the boss portions of the two insulators and which is filled with a suitable transformer oil. O-ring seals 190 are fitted between the central bosses of the insulator plates and the anode to prevent loss of oil from the transformer chamber.

The transformer core 91 is formed as a laminated mild steel bar of square section. It extends vertically between the insulator boss portions 184, 186 and its ends are located within recesses in those boss portions. The primary transformer winding 88 is wound on a first tubular former 401 fitted directly onto core 91 whereas the secondary winding 89 is wound on a second tubular former 402 so as to be spaced outwardly from the primary winding within the oil filled transformer chamber.

The cathode 43 in the form of a longitudinally slotted tube which is embedded in the peripheral wall portion 183, this being achieved by moulding the insulator around the cathode. The cathode has eight equally spaced longitudinal slots 191 so that it is essentially comprised of eight cathode strips 192 disposed between the slots and connected together at top and bottom only, the slots being filled with the insulating material of insulator 183.

Both the anode and cathode are made of nickel plated mild steel. The outer periphery of the anode is machined to form eight circumferentially spaced flutes 193 which have arcuate roots meeting at sharp crests or ridges 194 defined between the flutes. The eight anode crests 194 are radially aligned centrally of the cathode strips 192 and the perimeter of the anode measured along its external surface is equal to the combined widths of the cathode strips measured at the internal surfaces of these strips, so that over the major part of their lengths the anode and cathode have equal effective areas. This equalization of areas generally have not been available in prior art cylindrical anode/cathode arrangements.

As most clearly seen in FIG. 27 the upper end of anode 42 is relieved and fitted with an annular collar 200 the outer periphery of which is shaped to form an extension of the outer peripheral surface of the fluted anode. This collar is formed of an electrically insulated plastics material such as polyvinyl chloride or teflon. A locating pin 205 extends through collar 200 to project upwardly into an opening in upper insulating plate 182 and to extend downwardly into a hole 210 in the cathode. The collar is thus located in correct annular alignment relative to the anode and the anode is correctly aligned relative to the cathode.

The annular space 195 between the anode and cathode serves as the electrolyte solution chamber. Initially this chamber is filled approximately 75% full with an electrolyte solution of 25% potassium hydroxide in distilled water. As the electrolysis reaction progresses hydrogen and oxygen gases collect in the upper part of this chamber and water is admitted to maintain the level of electrolyte solution in the chamber. Insulating collar 200 shields the cathode in the upper region of the chamber where hydrogen and oxygen gases collect to prevent any possibility of arcing through these gases between the anode and cathode.

Electrolyte chamber 195 is divided by a tubular membrane 196 formed by nylon woven mesh material 408 stretched over a tubular former 197 formed of very thin sheet steel. As most clearly illustrated in FIGS. 20 and 21 former 197 has upper and lower rim portions 198, 199 connected by circumferentially spaced strip portions 201. The nylon mesh material 408 may be simply folded around the upper and lower insulators 182, 183 so that the former is electrically isolated from all other components of the cell. Material 408 has a mesh size which is so small that the mesh openings will not pass bubbles of greater than 0.004 inch diameter and the material can therefore serve as a barrier against mixing of hydrogen and oxygen generated at the cathode and anode respectively while permitting the electrolytic flow of current between the electrodes. The upper rim portion 198 of the membrane former 197 is deep enough to constitute a solid barrier through the depth of the gas collection chamber above the electrolyte solution level so that there will be no mixing of hydrogen and oxygen within the upper part of the chamber.

Fresh water is admitted into the outer section of chamber 195 via an inlet nozzle 211 formed in upper closure plate 178. The electrolyte solution passes from the outer to the inner sections of chamber 195 through the mesh membrane 408.

Nozzle 211 has a flow passage 212 extending to an electrolyte inlet valve 213 controlled by a float 214 in chamber 195. Valve 213 comprises a bushing 215 mounted within an opening extending downwardly through upper closure plate 179 and the peripheral flange 185 of upper insulator 182 and providing a valve seat which cooperates with valve needle 216. Needle 216 rests on a pad 217 on the upper end of float 214 so that when the electrolyte solution is at the required level the float lifts the needle hard against the valve seat. The float slides vertically on a pair of square section slide rods 218 extending between the upper and lower insulators 182 and 183. These rods, which may be formed of polytetrafluoroethylene extend through appropriate holes 107 through the float.

The depth of float 214 is chosen such that the electrolyte solution fills only approximately 75% of the chamber 195, leaving the upper part of the chamber as a gas space which can accommodate expansion of the generated gas due to heating within the cell.

As electrolysis of the electrolyte solution within chamber 195 proceeds, hydrogen gas is produced at the cathode and oxygen gas is produced at the anode. These gases bubble upwardly into the upper part of chamber 195 where they remain separated in the inner and outer compartments defined by membrane and it should be noted that the electrolyte solution enters that part of the chamber which is filled with oxygen rather than hydrogen so there is no chance of leakage of hydrogen back through the electrolyte inlet nozzle.

The abutting faces of upper closure plates 178, 179 have matching annular grooves forming within the upper closure inner and outer gas collection passages 221, 222. Outer passage 222 is circular and it communicates with the hydrogen compartment of chamber 195 via eight ports 223 extending downwardly through top closure plate 179 and the peripheral flange of upper insulator 182 adjacent the cathode strips 192. Hydrogen gas flows upwardly through ports 223 into passage 222 and thence upwardly through a one-way valve 224 (FIG. 19) into a reservoir 225 provided by a plastic housing 226 bolted to top closure plate 178 via a centre stud 229 and sealed by a gasket 227. The lower part of housing 114 is charged with water. Stud 229 is hollow and its lower end has a transverse port 228 so that, on removal of a sealing cap 229 from its upper end it can be used as a filter down which to pour water into the reservoir 225. Cap 229 fits over a nut 231 which provides the clamping action on plastic housing 226 and resilient gaskets 232, 233 and 234 are fitted between the nut and cover, between the cap and the nut and between the cap and the upper end of stud 229.

One-way valve 224 comprises a bushing 236 which projects downwardly into the annular hydrogen passage 221 and has a valve head member 237 screw fitted to its upper end to provide clamping action on top closure plate 178 between the head member and a flange 238 at the bottom end bushing 236. Bushing 236 has a central bore 239, the upper end of which receives the diamond cross-section stem of a valve member 240, which also comprises a valve plate portion 242 biased against the upper end of the bushing by compression spring 243. Valve member 240 is lifted against the action of spring 243 by the pressure of hydrogen gas within passage 221 to allow the gas to pass into the interior of valve head 237 and then out through ports 220 in that member into reservoir 225.

Hydrogen is withdrawn from reservoir 225 via a stainless steel crooked tube 241 which connects with a passage 409. Passage 409 extends to a port 250 which extends downwardly through the top and bottom closure plates 178, 179 and top insulator 182 into a hydrogen duct 244 extending vertically within the casting of casing 171. Duct 244 is of triangular cross-section. As will be explained below, the hydrogen passes from this duct into a mixing chamber defined in the gas mixing and delivery unit 38 which is bolted to casing 171.

Oxygen is withdrawn from chamber 195 via the inner annular passage 221 in the top closure. Passage 221 is not circular but has a scalloped configuration to extend around the water inlet. Oxygen enters it through eight ports 245 extended through top closure plate 179 and the annular flange portion of upper insulator 182. The oxygen flows upwardly from passage 222 through a one-way valve 246 and into a reservoir 260 provided by a plastic housing 247. The arrangement is similar to that for withdrawal of hydrogen and will not be described in great detail. Suffice to say that the bottom of the chamber is charged with water and the oxygen is withdrawn through a crooked tube 248, an outlet passage 249 in top closure plate 178, and a port which extends downwardly through closure plates 178, 179 and top insulator 182 into a triangular cross-section oxygen duct 251 extending vertically within casing 171 disposed opposite hydrogen duct 244. The oxygen is also delivered to the gas mixing chamber of the mixing and delivery unit 38.

The pressure sensing tube 63 for switch 62 is connected via a tapered thread connector 410 and a passage 411 in the top closure plate 178 directly to the annular hydrogen passage 222. If the pressure within the passage rises above a predetermined level, switch 62 is operated to disconnect capacitor C2 from the common negative line 54. This removes the negative signal from capacitor C2 which is necessary to maintain continuous operation of the pulse generating circuitry for generating the triggering pulses on thyristor T1 and these triggering pulses therefore cease. The transformer TR1 continues to remain in operation to charge dumping capacitor C5 but because thyristor T1 cannot be triggered dumping capacitor C5 will simply remain charged until the hydrogen pressure in passage 222, and therefore in chamber 195 falls below the predetermined level and triggering pulses are applied once more to thyristor T1. Pressure actuated switch 62 thus controls the rate of gas production according to the rate at which it is withdrawn. The stiffness of the control springs for gas escape valves 224, 246 must of course be chosen to allow escape of the hydrogen and oxygen in the proportions in which they are produced by electrolysis, i.e. in the ratios 2:1 by volume.

Reservoirs 225, 260 are provided as a safety precaution. If a sudden back-pressure were developed in the delivery pipes this could only shatter the plastic housings 226, 247 and could not be transmitted back into the electrolytic cell. Switch 62 would then operate to stop further generation of gases within the cell.

The electrical connections of secondary transformer coil 89 to the anode and the cathode are shown in FIG. 14. One end of coil 89 is extended as a wire 252 which extends into a blind hole in the inner face of the anode where it is gripped by a grub screw 253 screwed into a threaded hole extended vertically into the anode underneath collar 200. A tapered nylon plug 254 is fitted above screw 253 to seal against loss of oil from the interior of the anode. The other end of coil 89 is extended as a wire 255 to pass downwardly through a brass bush 256 in the bottom insulator 183 and then horizontally to leave casing 171 between bottom insulating disc 176 and insulator 183.

As most clearly shown in FIG. 23, brass bush 256 has a head flange 257 and is fitted at its lower end with a nut 258 whereby it is firmly clamped in position. Gaskets 259, 261 are disposed beneath head flange 257 and above nut 258 respectively.

At the location where wire 255 is extended horizontally to leave the casing the upper face of disc 176 and the lower face of insulator 183 are grooved to receive and clamp onto the wire. Disc 176 and insulator 183 are also extended radially outwardly at this location to form tabs which extend out beneath casing 171 and ensure proper insulation of the wire through to the outer periphery of the casing.

Outside the casing, wire 255 is connected to a cathode terminal bolt 262. Terminal bolt 262 has a head which is received in a socket in separate head piece 263 shaped to suit the cylindrically curved inner periphery of the cathode and nickel plated to resist chemical attack by the electrolyte solution. The stem of the terminal bolt extends through openings in the cathode and peripheral wall portion 188 of insulator 183 and air insulating bush fitted in an aligned opening in the casing wall 172. The head piece 263 of the terminal bolt is drawn against the inner periphery of the cathode by tightening of a clamping nut 265 and the end of wire 255 has an eye which is clamped between nut 265 and a washer 266 by tightening a terminal end nut 267. A washer 268 is provided between nut 265 and brush 264 and a sealing O-ring 269 is fitted in an annular groove in the bolt stem to engage the inner periphery of the bush in order to prevent escape of electrolyte solution. The terminal connection is covered by a cover plate 271 held in place by fixing screws 272.

The two ends of the primary transformer coil 88 are connected to strip conductors 273, 274 which extend upwardly through the central portion of upper insulator 183. The upper ends of conductors 273, 274 project upwardly as pins within a socket 275 formed in the top of upper insulator 183. The top of socket 275 is closed by a cover 276 which is held by a centre stud 277 and through which wires 278, 279 from the external circuit are extended and connected to conductors 273, 274 by push-on connectors 281, 282.

Figure 2:
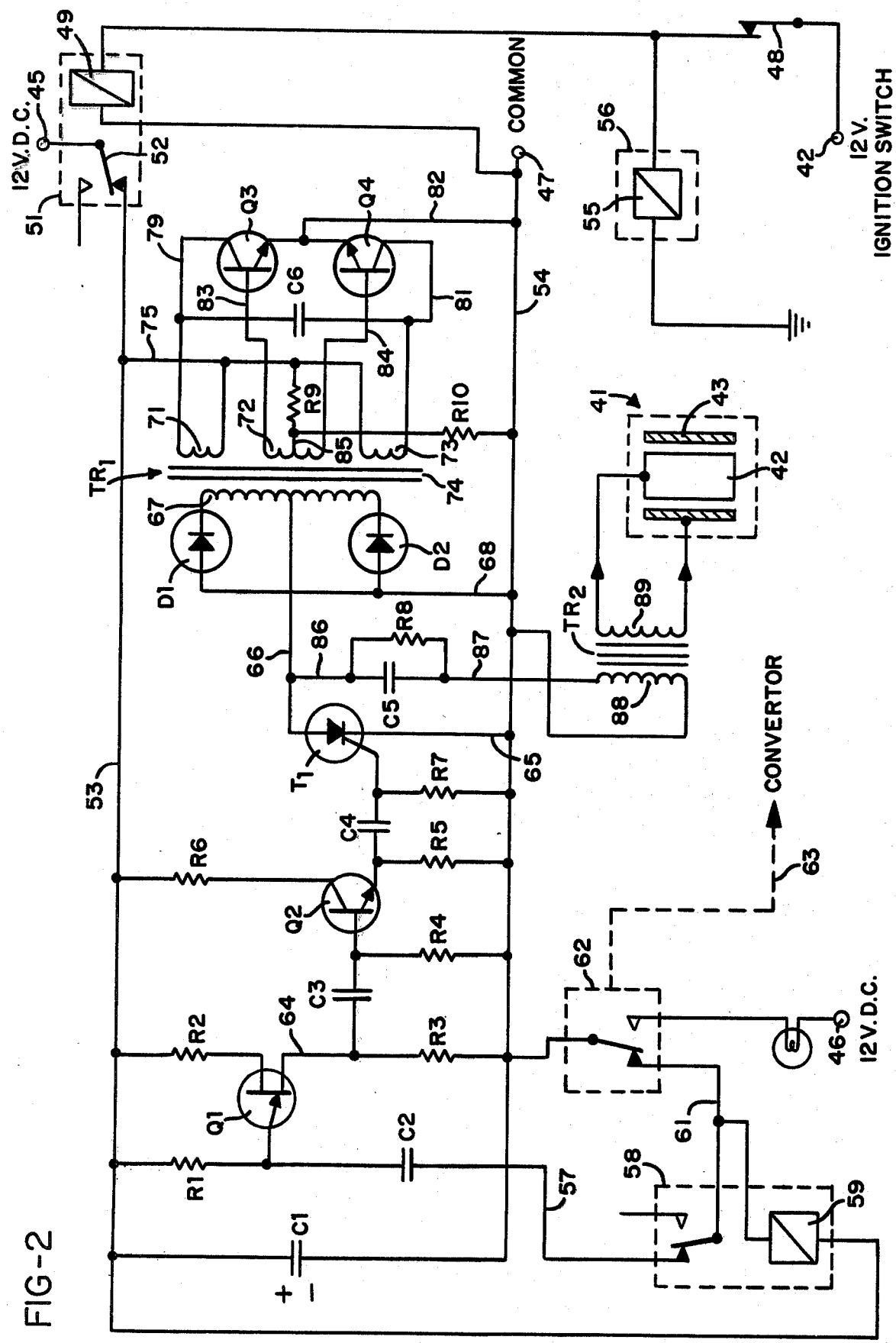
FIG. 2 is a circuit diagram of the fuel supply apparatus.
Figure 3:
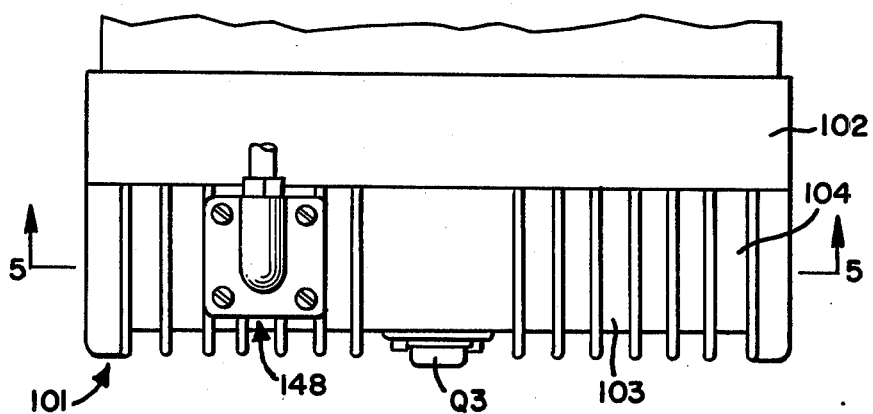
FIG. 3 is a plan view of a housing which carries electrical components of the fuel supply apparatus.
Figure 4:
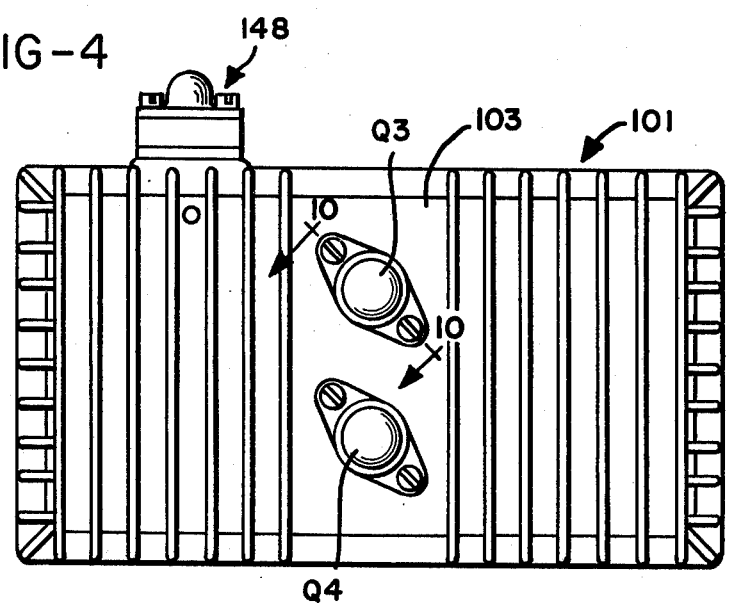
FIG. 4 is an elevation view of the housing shown in FIG. 3.
Figure 13:
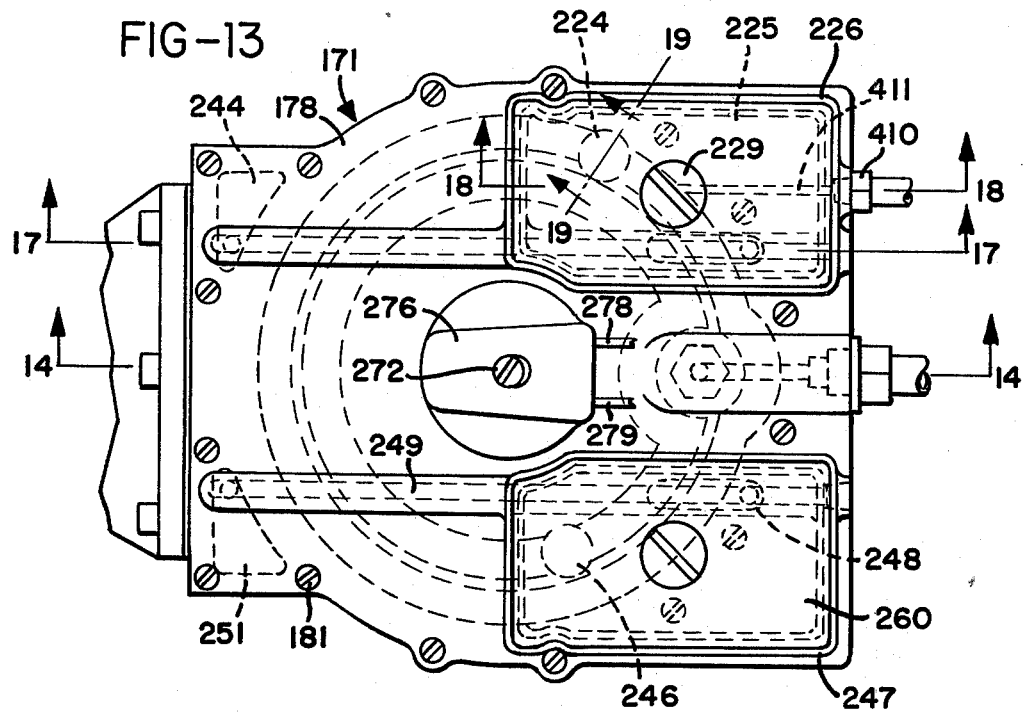
FIG. 13 is a plan view of an electrolytic cell incorporated in the fuel supply apparatus.
Figure 17:
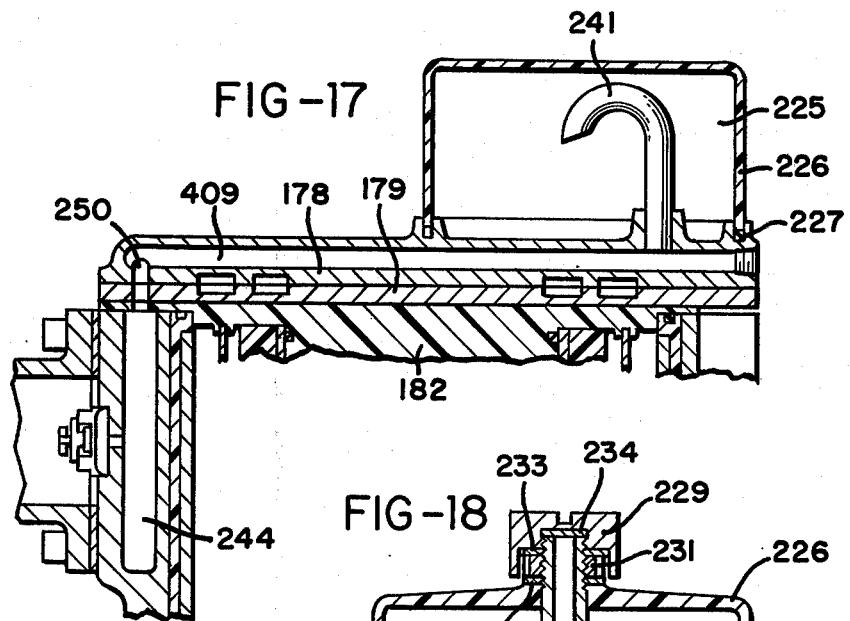
FIG. 17 is a cross-section on the line 17—17 in FIG. 13.
Figure 18:
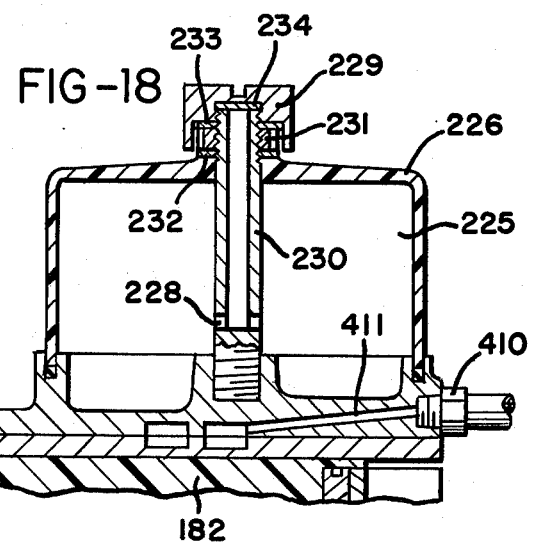
FIG. 18 is a cross-section on the line 18—18 of FIG. 13.

The transformer connections shown in FIG. 14 are in accordance with the circuit of FIG. 2, i.e. the ends of secondary coil 89 are connected directly between the anode and the cathode. Transformer TR2 is a step-down transformer and, assuming an input of pulses of 22 amps at 300 volts and a coil ratio between the primary and secondary of 10:1 the output applied between the anode and the cathode will be pulses of 200 amps at a low voltage of the order of 3 volts. The voltage is well in excess of that required for electrolysis to proceed and the very high current achieved produces a high rate of yield of hydrogen and oxygen. The rapid discharge of energy which produces the large current flow will be accompanied by a release of heat. This energy is not entirely lost in that the consequent heating of the electrolyte solution increases the mobility of the ions which tends to increase the rate of electrolysis.

The configuration of the anode and cathode arrangement of electrolytic cell 41 is of significant importance. The fluted external periphery of the anode causes a concentratiton of current flow which produces a better gas yield over a given electrode area. This particular configuration also causes the surface area of the anode to be extended and permits an arrangement in which the anode and cathode have equal surface areas which is most desirable in order to minimize electrical losses. It is also desirable that the anode and cathode surfaces at which gas is produced be roughened, for example by sand-blasting. This promotes separation of the gas bubbles from the electrode surfaces and avoids the possibility of overvoltages.

The arrangement of the secondary transformer in which the central anode is surrounded by the cathode is also of great importance. The anode, being constructed of a magnetic material, is acted on by the magnetic field of transformer TR2 to become, during the period of energization of that transformer, a strong conductor of magnetic flux. This in turn creates a strong magnetic field in the interelectrode space between the anode and the cathode. It is believed that this magnetic field increases the mobility of the ions in solution thereby improving the efficiency of the cell.

The heat generated by transformer TR2 is conducted via the anode to the electrolyte solution and increases the mobility of the ions within the electrolyte solution as above mentioned. The cooling fins 180 are provided on casing 171 to assist in dissipation of excess generated heat. The location of the transformer within the anode also enables the connections of the secondary coil 89 to the anode and cathode to be made of short, well protected conductors.

As mentioned above the hydrogen and oxygen gas generated in electrolytic cell 41 and collected in ducts 244, 251 is delivered to a gas mixing chamber of the mixing and delivery unit 38. More specifically, these gases are delivered from ducts 244, 251 via escape valves 283, 284 (FIG. 15) which are held in position over discharge ports 285, 286 from the ducts by means of a leaf spring 287. The outer ends of spring 287 engage the valves 283, 284 and the centre part of the spring is bowed inwardly by a clamping stud 288 screwed into a tapped hole in a boss 289 formed in the cell casing 171.

Valve 283 is detailed in FIGS. 28 and 29 and valve 284 is of identical construction. Valve 283 includes an inner valve body 291 having a cap portion 292 and an annular end ring portion 293 which holds an annular valve seat 294. A valve disc 295 is biased against the valve seat by a valve spring 296 reacting against the cap portion 292. An outer valve cover 297 fits around the inner member 291 and is engaged by spring 287 to force the inner member firmly into a socket in the wall of the cell casing so to cover the hydrogen discharge port 285. The end ring portion 293 of the inner body member beds on a gasket 298 within the socket.

During normal operation of the apparatus valves 283, 284 act as simple one-way valves by movements of their spring loaded valve plates. However, if an excessive gas pressure should arise within the electrolytic cell these valves will be forced back against the action of holding spring 287 to provide pressure relief. The escaping excess gas then flows to atmosphere via the mixing and delivery unit 38 as described below. The pressure at which valves 283, 284 will lift away to provide pressure relief may be adjusted by appropriate setting of stud 288, which setting is held by a nut 299.

The construction of the gas mixing and delivery unit 38 is shown in FIGS. 30 and 40. It comprises an upper body portion 301 which carries an air filter assembly 302, an intermediate body portion 303, which is bolted to the casing of electrolytic cell 41 by six studs 304, and successive lower body portions 305, 300, the latter of which is bolted to the inlet manifold of the engine by four studs 306.

The bolted connection between intermediate body portion 303 and the casing of the electrolytic cell is sealed by a gasket 307. This connection surrounds valves 283, 284 which deliver hydrogen and oxygen gases directly into a mixing chamber 308 (FIG. 34) defined by body portion 303. The gases are allowed to mix together within this chamber and the resulting hydrogen and oxygen mixture passes along small diameter horizontal passageway 309 within body portion 303 which passageway is traversed by a rotary valve member 311. Valve member 311 is conically tapered and is held within a correspondingly tapered valve housing by a spring 312 (FIG. 38) reacting against a bush 313 which is screwed into body portion 303 and serves as a mounting for the rotary valve stem 314. Valve member 311 has a diametral valve port 315 and can be rotated to vary the extent to which this port is aligned with passageway 309 thereby to vary the effective cross-section for flow through that passageway. As will be explained below, the rotational positions of the valve member is controlled in relation to the engine speed.

Passage 309 extends to the lower end of a larger diameter vertical passageway 316 which extends upwardly to a solenoid freed valve 310 incorporated in a valve and jet assembly denoted generally as 317.

Assembly 317 comprises a main body 321 (FIG. 32) closed at the top by a cap 322 when the assembly is clamped to body portion 303 by two clamping studs 323 to form a gas chamber 324 from which gas is to be drawn through jet nozzles 318 into two vertical bores or throats 319 (FIG. 31) in body portion 303. The underside of body 321 has a tapped opening into which is fitted an externally screw threaded valve seat 325 of valve 310. A valve member 326 is biased downwardly against seat 325 by a spring 327 which reacts against cap 322. Spring 327 encircles a cylindrical stem 328 of valve member 326 which stem projects upwardly through an opening in cap 322 so that it may be acted on by solenoid 56 which is mounted immediately above the valve in upper body portion 301.

Solenoid 56 is comprised of an outer insulating casing 366 which has two mounting flanges 367. This casing houses the copper windings constituting coil 55. These are wound on a plastic bobbin 369 disposed about a central mild steel core 371. The core has a bottom flange 372 and the bobbin and coils are held clamped in the casing through insulating closure 373 acted on by flange 372 on tightening of a clamping nut 374 which is fitted to the other end of the core.

Upper body portion 301 of unit 38 is tubular but at one side it has an internal face shaped to suit the exterior profile of solenoid casing 366 and mounting flanges 367. Two mounting screws 375 screw into holes in this face and engage slots 376 in the mounting flanges 367 so that the height of the solenoid above valve 310 can be adjusted. The two terminals 377 are connected into the electrical circuit by wires (not shown) which may be extended into unit 38 via the air filter assembly.

When solenoid 56 is energized its magnetized core attracts valve stem 328 and valve member 326 is lifted until stem 328 abuts the lower flange 372 of the solenoid core. Thus valve 310 is opened when the ignition switch is closed and will close under the influence of spring 327 when the ignition switch is opened. Vertical adjustment of the solenoid position controls the lift of valve member 326 and therefore the maximum fuel flow rate through unit 38.

Electrolyte cell 41 produces hydrogen in the ratio 2:1 to provide a mixture which is by itself completely combustible. However, as used in connection with existing internal combustion engines the volume of hydrogen and oxygen required for normal operation is less than that of a normal fuel air mixture. Thus a direct application to such an engine of only hydrogen and oxygen in the amount required to meet power demands will result in a vacuum condition within the system. In order to overcome this vacuum condition provision is made to draw make-up air into throats 319 via the air filter assembly 302 and upper body portion 301.

Upper body portion 301 has a single interior passage 328 through which make-up air is delivered to the dual throats 319. It is fastened to body portion 303 by clamping studs 329 and a gasket 331 is sandwiched between the two body portions. The amount of make-up air admitted is controlled by an air valve flap 332 disposed across passage 328 and rotatably mounted on a shaft 333 to which it is attached by screws 334. The valve flap is notched to fit around solenoid casing 366. Shaft 333 extends through the wall of body portion 301 and outside that wall it is fitted with a bracket 335 which carries an adjustable setting screw 336 and a biasing spring 337. Spring 337 provides a rotational bias on shaft 333 and during normal running of the engine it simply holds flap 332 in a position determined by engagement of setting screw 336 with a flange 338 of body portion 301. This position is one in which the flap almost completely closes passage 328 to allow only a small amount of make-up air to enter, this small amount being adjustable by appropriate setting of screw 336. Screw 336 is fitted with a spring 339 so that it will hold its setting.

Although flaps 332 normally serve only to adjust the amount of make-up air admitted to unit 38, it also serves as a pressure relief valve if excessive pressures are built up, either due to excessive generation of hydrogen and oxygen gases or due to buring of gases in the inlet manifold of the engine. In either event the gas pressure applied to flaps 332 will cause it to rotate so as to open passage 328 and allow gases to escape back through the air filter. It will be seen in FIG. 32 that flap mounting shaft 333 is offset from the centre of passage 328 such that internal pressure will tend to open the flap and thus exactly the reverse of the air valve in a conventional gasoline carburetor.

Air filter assembly 302 comprises an annular bottom pan 341 which fits snugly onto the top of upper body portion 301 and domed filter element 342 held between an inner frame 343 and an outer steel mesh covering 344. The assembly is held in position by a wire and eyebolt fitting 345 and clamping nut 346.

Body portion 305 of unit 38 (FIG. 31), which is fastened to body portion 303 by clamping studs 347, carries throttle valve apparatus to control engine speed. It has two vertical bores 348, 349 serving as continuations of the dual throats which started in body portion 303 and these are fitted with throttle valve flaps 351, 352 fixed to a common throttle valve shaft 353 by fixing screws 354. Both ends of shaft 353 are extended through the wall of body portion 305 to project outwardly therefrom. One end of this shaft is fitted with a a bracket 355 via which it is connected as in a conventional carburetor to a throttle cable 356 and also to an automatic transmission kick-down control linkage 357. A biasing spring 358 acts on shaft 353 to bias throttle flaps toward closed positions as determined by engagement of a setting screw 359 carried by bracket 355 with a plate 361 projecting from body portion 303.

The other end of throttle valve shaft 353 carries a lever 362 the outer end of which is connected to a wire link 407 by means of which a control connection is made to the valve stem 314 of valve member 311 via a further lever 406 connected to the outer end of the valve stem. This control connection is such that valve member 311 is at all times positioned to pass a quantity of gas mixture appropriate to the engine speed as determined by the throttle setting. The initial setting of valve member 311 can be adjusted by selection between two connection holes 405 in lever 406 and by bending of link 407.

Body portion 303 is fastened to the bottom body portion 300 of unit 38 by four clamping studs 306. The bottom body portion has two holes 364, 365 which form continuations of the dual throats and which diverge in the downward direction so as to direct the hydrogen, oxygen and air mixture delivered through these throats outwardly toward the two banks of cylinder inlets. Since this fuel is dry, a small quantity of oil vapour is added to it via a passage 403 in body portion 305 to provide some upper cylinder lubrication. Passage 403 receives oil vapour through a tube 404 connected to a tapping on the engine tapped cover. It discharges the oil vapour downwardly onto a relieved top face part 368 of body portion 300 between holes 364, 365. The vapour impinges on the relieved face part and is deflected into the two holes to be drawn with the gases into the engine.

In the illustrated gas mixing and delivery unit 38, it will be seen that passageway 309, vertical passageway 316, chamber 324 and nozzles 318 constitute transfer passage means via which the hydrogen mixture pass to the gas flow duct means comprised of the dual throats via which it passes to the engine. The transfer passage means has a gas metering valve comprised of the valve member 311 and the solenoid operated valve is disposed in the transfer passage means between the metering valve and the gas flow duct means. The gas metering valve is set to give maximum flow rate through the transfer passage means at full throttle setting of throttle flaps 351, 352. The solenoid operated valve acts as an on/off valve so that when the ignition switch is opened the supply of gas to the engine is positively cut-off thereby preventing any possibility of spontaneous combustion in the cylinders causing the engine to "run on". It also acts to trap gas in the electrolytic cell and within the mixing chamber of the mixing and delivery unit so that gas will be available immediately on restarting the engine.

Dumping capacitor C5 will determine a ratio of charging time to discharge time which will be largely independent of the pulse rate and the pulse rate determined by the oscillation transistor Q1 must be chosen so that the discharge time is not so long as to produce overheating of the transformer coils and more particularly the secondary coil 89 of transformer TR2. Experiments indicate that overheating problems are encountered at pulse rates below about 5,000 and that the system will behave much like a DC system, with consequently reduced performance at pulse rates greater than about 40,000. A pulse rate of about 10,000 pulses per minute will be nearly optimum. With the saw tooth wave input and sharply spiked output pulses of the preferred oscillator circuit the duty cycle of the pulses produced at a frequency of 10,000 pulses per minute was about 0.006. This pulse form helps to minimize overheating problems in the components of the oscillator circuit at the high pulse rates involved. A duty cycle of up to 0.1, as may result from a square wave input, would be feasible but at a pulse rate of 10,000 pulses per minute some of the components of the oscillator circuit would then be required to withstand unusually high heat inputs. A duty cycle of about 0.005 would be a minimum which could be obtained with the illustrated type of oscillator circuitry.

From the foregoing description it can be seen that the electrolytic cell 41 converts water to hydrogen and oxygen whenever ignition switch 44 is closed to activate solenoid 51, and this hydrogen and oxygen are mixed in chamber 308. Closure of the ignition switch also activates solenoid 56 to permit entry of the hydrogen and oxygen mixture into chamber 319, when it mixes with air admitted into the chamber by air valve flap 332. As described above, air valve flap 332 may be set to admit air in an amount as required to avoid a vacuum condition in the engine.

In operation the throttle cable 356 causes bracket 355 to pivot about throttle valve shaft 353, which rotates flap 351 to control the amount of hydrogen-oxygen-air mixture entering the engine. At the same time shaft 353 acts via the linkage shown in FIG. 37 to control the position of shaft 314, and shaft 314 adjusts the amount of hydrogen-oxygen mixture provided for mixing with the air. As shown in FIG. 30, bracket 355 may also be linked to a shaft 357, which is connected to the automobile transmission. Shaft 357 is a common type of shaft used for down shifting into a passing gear when the throttle has been advanced beyond a predetermined point. Thus there is provided a compact fuel generation system which is compatible with existing internal combustion engines and which has been designed to fit into a standard passenger automobile.

While the form of apparatus herein described constitutes a preferred embodiment of the invention, it is to be understood that the invention is not limited to this precise form of apparatus, and that changes may be made therein without departing from the scope of the invention.

I claim:

1. For an internal combustion engine having inlet means to receive a combustible fuel, fuel supply apparatus comprising:
   a vessel to hold an aqueous electrolyte solution;
   an anode and a cathode to contact the electrolyte solution within the vessel;
   electrical supply means to apply between said anode and said cathode pulses of electrical energy to induce a pulsating current in the electrolyte solution thereby to generate by electrolysis hydrogen and oxygen gases;
   gas collection and delivery means to collect the hydrogen and oxygen gases and to direct them to the engine inlet means; and
   water admission means to admit water to said vessel;
   said electrical supply means comprising a source of direct current electrical energy of substantially uniform voltage and current and electrical converter means to convert that energy to said pulses, said converter means comprising a
   transformer means having primary coil means energized by direct current energy from said source and secondary coil means inductively coupled to the primary coil means; a dump capacitor connected to the secondary coil means of the transformer means so as to be charged by electrical output of that coil means; oscillator means to derive electrical pulses from direct current energy of said source; a switching device switchable from a non-conducting state to a conducting state in response to each of the electrical pulses derived by the oscillator means and connected to the secondary coil means of the transformer means and the dump capacitor such that each switching from its non-conducting state to its conducting state causes the dump capacitor to discharge and also short circuits the transformer means to cause the switching means to revert to its non-conducting state; and electrical conversion means to receive the pulse discharges from the dump capacitor and to convert them to said pulses of electrical energy which are applied between the anode and cathode.

2. Fuel supply as claimed in claim 1, wherein the electrical supply means applies said pulses of electrical energy at a frequency of ranging between about 5,000 and 40,000 pulses per minute.

3. Fuel supply apparatus as claimed in claim 2, wherein the electrical supply means applies said pulses of electrical energy at a frequency of about 10,000 pulses per minute.

4. Fuel supply apparatus as claimed in claim 2, wherein the electrical supply means comprises a source of direct current electrical energy of substantially uniform voltage and current and electrical converter means to convert that energy to said pulses.

5. Fuel supply apparatus as claimed in claim 1, wherein the electrical conversion means is a voltage step-down transformer comprising a primary coil to receive the pulse discharge from said dump capacitor and a secondary coil electrically connected between the anode and cathode and inductively coupled to the primary coil.

6. Fuel supply apparatus as claimed in claim 5, wherein said cathode encompasses the anode.

7. Fuel supply apparatus as claimed in claim 1, wherein the cathode encompasses the anode which is hollow and the primary and secondary coils of the second transformer means are disposed within the anode.

8. Fuel supply apparatus as claimed in claim 1, wherein the anode is tubular and its ends are closed to form a chamber which contains the primary and secondary coils of the second transformer means and which is charged with oil.

9. In combination with an internal combustion engine having an inlet for combustible fuel, fuel supply apparatus comprising:
   a. an electrolytic cell to hold an electrolytic conductor;
   b. a first hollow cylindrical electrode disposed within said cell and provided about its outer surface with a series of circumferentially spaced and longitudinally extending flutes;
   c. a second hollow cylindrical electrode surrounding said anode and segmented into a series of electrically connected longitudinally extending strip; said strips being equal in number to the number of said flutes, said strips having a total active surface area approximately equal to the total active surface area of said flutes, and said strips being in radial alignment with the crests of said flutes;
   d. current generating means for generating a flow of electrolysing current between said first and second electrodes;
   e. gas collection and delivery means to collect hydrogen and oxygen gases from the cell and to direct them to said fuel inlet of the engine; and
   f. water admission means to admit water to the cell.

10. The combination claimed in claim 9, wherein said current generating means comprises a transformer situated inside said first electrode.

11. The combination claimed in claim 10, wherein the secondary winding of said transformer is connected whereby said first electrode operates as an anode and said second electrode operates as a cathode.

12. The combination claimed in claim 11, wherein said current generating means further comprising means to generate a pulsed current in the primary winding of said transformer.

13. The combination claimed in claim 9, wherein the roots of said flutes are cylindrically curved.

14. The combination claimed in claim 10, wherein said current generating means comprises a source of direct current; a transformer means having primary coil means energized by direct current energy from said source and secondary coil means inductively coupled to the primary coil means; a dump capacitor connected to the secondary coil means of the transformer means so as to be charged by electrical output of that coil means; oscillator means to derive electrical pulses from direct current energy of said source, a switching device switchable from a non-conducting state to a conducting state in response to each of the electrical pulses derived by the oscillator means and connected to the secondary coil means of the transformer means and the dump capacitor such that each switching from its non-conducting state to its conducting state causes the dump capacitor to discharge and also short circuits the transformer means to cause the switching means to revert to its non-conducting state; and electrical conversion means to receive the pulse discharges from the dump capacitor and to convert them to said pulses of electriical electrical which are applied between said first and second electrodes.

15. The combination claimed in claim 10, wherein the electrical conversion means comprises a voltage step-down transformer having a primary coil to receive the pulse discharge from said dump capacitor and a secondary coil electrically connected between said first and second electrodes.

16. The combination of an internal combustion engine having an inlet to receive a combustible fuel and fuel supply apparatus comprising:
   a vessel to hold an aqueous electrolyte solution;
   a first hollow cylindrical electrode disposed within said vessel and provided about its outer surface with a series of circumferentially spaced and longitudinally extending flutes;
   a second hollow cylindrical electrode surrounding the first electrode and segmented into a series of electrically connected longitudinally extending strips; said strips being equal in number to the number of said flutes and being in radial alignment with the crests of said flutes;
   current generating means for generating a pulsating current between said first and second electrodes to produce hydrogen and oxygen gases within the vessel;
   gas collection and delivery means to collect the hydrogen and oxygen gases and to direct them to the engine inlet means; and
   water admission means to admit water to the vessel.

17. The combination claimed in claim 26, wherein said current generating means comprises a source of direct current; a first transformer means having primary coil means energized by direct current energy from said source and secondary coil means inductively coupled to the primary coil means; a dump capacitor connected to the secondary coil means of the first transformer means so as to be charged by electrical output of that coil means; oscillator means to derive electrical pulses from direct current energy of said source; a switching device switchable from non-conducting state to a conducting state in response to each of the electrical pulses derived by the oscillator means and connected to the secondary coil means of the first transformer means and the dump capacitor such that each switching from its non-conducting state to its conducting state causes the dump capacitor to discharge and also short circuits the first transformer means to cause a second transformer to receive the pulse discharges from the dump capacitor and to transform them to pulses of electrical energy which are applied between said first and second electrodes.

18. The combination claimed in claim 26, wherein the second transformer means has primary coil means energized by the pulse discharges from the dump capacitor and secondary coil means which is inductively coupled to the primary coil means and is connected to the first and second electrodes such that the first electrode operates as an anode and the second electrode operates as a cathode.

* * * * *

UNITED STATES PATENT AND TRADEMARK OFFICE
CERTIFICATE OF CORRECTION

PATENT NO. : 3,980,053
DATED : September 14, 1976
INVENTOR(S) : Stephen Horvath

It is certified that error appears in the above–identified patent and that said Letters Patent are hereby corrected as shown below:

Col. 1, line 68, "Emich al" should be --Emich et al--.

Col. 2, line 11, "direct input" should be --direct current input--.

Col. 2, line 33, "diode" should be --anode--.

Col. 6, line 59, "Wnen" should be --When--.

Col. 9, line 22, after transistors. delete "ransistors."

Col. 14, line 41, "brush" should be --bush--.

Col. 15, line 9, "concentratiton" should be --concentration--.

Col. 18, line 51, "hydrogen mixture" should be --hydrogen and oxygen mixture--.

Col. 19, line 20, "up to 0.1" should be --up to about 0.1--.

Col. 21, line 38, "claim 10" should be --claim 9--.

Col. 21, lines 58 and 59, after of, delete "electriical".

Col. 22, line 1, "claim 10" should be --claim 9--.

Col. 22, line 30, "claim 26" should be --claim 16--.

Col. 22, line 52, "claim 26" should be --claim 16--.

Signed and Sealed this

Seventh Day of December 1976

[SEAL]

Attest:

RUTH C. MASON
Attesting Officer

C. MARSHALL DANN
Commissioner of Patents and Trademarks